(12) United States Patent
Nakamura

(10) Patent No.: US 7,459,902 B2
(45) Date of Patent: Dec. 2, 2008

(54) ELECTRONIC DEVICE TESTING APPARATUS

(75) Inventor: Hiroto Nakamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 8 days.

(21) Appl. No.: 10/512,065

(22) PCT Filed: Apr. 25, 2002

(86) PCT No.: PCT/JP02/04123

§ 371 (c)(1),
(2), (4) Date: Nov. 12, 2004

(87) PCT Pub. No.: WO03/091740

PCT Pub. Date: Nov. 6, 2003

(65) Prior Publication Data

US 2005/0162150 A1    Jul. 28, 2005

(51) Int. Cl.
*G01R 31/28* (2006.01)
*G01R 31/02* (2006.01)

(52) U.S. Cl. ................................. 324/158.1

(58) Field of Classification Search ............... 324/73.1, 324/158.1, 754–758, 760–765; 209/571–572; 439/482, 824; 29/840, 832, 843
See application file for complete search history.

(56) References Cited

U.S. PATENT DOCUMENTS

| | | | | | |
|---|---|---|---|---|---|
| 5,629,632 | A | * | 5/1997 | Tsutsumi | ..................... 324/758 |
| 6,007,348 | A | * | 12/1999 | Murphy | ....................... 439/70 |
| 6,066,822 | A | | 5/2000 | Nemoto et al. | |
| 6,111,246 | A | * | 8/2000 | Watanabe et al. | ........ 250/222.1 |
| 6,627,483 | B2 | * | 9/2003 | Ondricek et al. | ............ 438/117 |
| 6,975,127 | B2 | * | 12/2005 | DiOrio | ....................... 324/754 |
| 7,129,726 | B2 | * | 10/2006 | Tashiro et al. | ............... 324/754 |

FOREIGN PATENT DOCUMENTS

| | | |
|---|---|---|
| CN | 1159227 A | 9/1997 |
| CN | 1169028 A | 12/1997 |
| CN | 1237714 A | 12/1999 |
| DE | 196 80 785 T1 | 9/1997 |
| DE | 197 13 986 A1 | 11/1997 |
| DE | 198 81 127 T1 | 8/1999 |
| JP | 3-231438 A | 10/1991 |
| JP | 9-61491 A | 3/1997 |
| JP | 9-101344 A | 4/1997 |
| JP | 9-325173 A | 12/1997 |
| JP | 10-260225 A | 9/1998 |
| JP | 11-231020 A | 8/1999 |
| SG | 60052 A | 2/1999 |
| WO | WO-97/05496 A1 | 2/1997 |

* cited by examiner

*Primary Examiner*—Ha Nguyen
*Assistant Examiner*—Trung Q Nguyen
(74) *Attorney, Agent, or Firm*—Birch, Stewart, Kolasch & Birch, LLP

(57) ABSTRACT

An electronic device testing apparatus for conducting a test by pressing input/output terminals of electronic devices to be tested (20) against contact portions (110a) of a test head (110) while holding the electronic devices to be tested (20) on electronic device conveying media (11, 12, 13): wherein the electronic device testing apparatus comprises a test head (100) provided with a plurality of contact groups (111, 112, 113) made by sets of contact portions (100a), and a plurality of moving means capable of controlling independently from each other; and the respective moving means move the electronic device conveying media (11, 12, 13) loaded with the electronic devices to be tested (20) to corresponding contact groups (111, 112, 113) to conduct a test.

10 Claims, 15 Drawing Sheets

ELECTRONIC DEVICE TESTING APPARATUS

TECHNICAL FIELD

The present invention relates to an electronic device testing apparatus for testing an electronic device, and an electronic device testing apparatus capable of conducting a test for any arrangement of electronic devices to be tested on an electronic device conveying medium with a high testing efficiency.

BACKGROUND ART

In an electronic device testing apparatus called a handler, a large number of electronic devices held on a tray are conveyed into the electronic device testing apparatus, and the respective electronic devices are brought to electronically contact a test head for conducting a test by an electronic device testing apparatus body (hereinafter, also referred to as a tester). When the test is finished, the electronic devices are taken out from the test head and reloaded to trays in accordance with the test results so as to be classified to categories of good ones and defective ones, etc.

In conventional electronic device testing apparatuses, there is a type wherein a tray for holding pre-test electronic devices or post-tested electronic devices (hereinafter, also referred to as a customer tray) differs from a tray conveyed by circulating inside the electronic device testing apparatus (hereinafter, also referred to as a test tray). In an electronic device testing apparatus of this kind, electronic devices are reloaded between the customer tray and the test tray before and after the test, and the electronic devices are pressed against a test head in a state of being carried on the test tray in a test step for conducting a test by bringing the electronic devices to contact the test head.

On the other hand, there is known a type wherein electronic devices held on a customer tray are applied with a thermal stress by using a heat plate, etc., then, some of them are picked up by suction heads at a time, conveyed to a test head, and brought to electronically contact. In a test step of an electronic device testing apparatus of this kind, electronic devices are pressed against the test head in a state of being picked up by the suction heads.

When being pressed, a large number of contact portions are provided to the test head (Normally, the number of test positions capable of measuring at a time, that is, the simultaneously measured number is limited to $2^n$, that is 32 or 64, per one electronic device testing apparatus. Note that "n" is a natural number.), and by conducting tests on a large number of electronic devices at a time, tests with high throughput are conducted.

Conventionally, when conducting tests on electronic devices, the test has been conducted in a final step of production steps of the electronic devices, so that a test has been conducted on completed electronic devices after steps of molding and wire bonding, etc. are finished.

However, when judged to be defective by the test after finishing the production steps, steps up to the completion after becoming a state of being ready for the test may be wasted, so that it is preferable that the test is conducted when it became to be in the state of being ready for the test and the defectives are taken away at this stage.

In the production steps of electronic devices, as shown in FIG. 16(a) to FIG. 16(h), due to limitation of the nature of the electronic device 20, the electronic devices 20 to be tested are loaded on an electronic device conveying medium of strip formats 10, etc. for preventing the electronic devices 20 from parting for conveying within and between respective steps. But the electronic device conveying medium 10 loads any number of electronic devices 20 and has any arrangement of the electronic devices 20. Note that FIG. 16(a) shows the electronic device conveying medium 10 loaded with electronic devices 20 by the number of 96 in arrangement of 4 rows by 24 columns, FIG. 16(b) shows the electronic device conveying medium 10 loaded with electronic devices 20 by the number of 60 in arrangement of 3 rows by 20 columns, FIG. 16(c) shows the electronic device conveying medium 10 loaded with electronic devices 20 by the number of 48 in arrangement of 3 rows by 16 columns, FIG. 16(d) shows the electronic device conveying medium 10 loaded with electronic devices 20 by the number of 36 in arrangement of 3 rows by 12 columns, FIG. 16(e) shows the electronic device conveying medium 10 loaded with electronic devices 20 by the number of 32 in arrangement of 2 rows by 16 columns, FIG. 16(f) shows the electronic device conveying medium 10 loaded with electronic devices 20 by the number of 24 in arrangement of 2 rows by 12 columns, FIG. 16(g) shows the electronic device conveying medium 10 loaded with electronic devices 20 by the number of 32 in arrangement of 4 rows by 8 columns, and FIG. 16(h) shows the electronic device conveying medium 10 loaded with electronic devices 20 by the number of 36 in arrangement of 2 rows by 18 columns.

Accordingly, as explained above, to conduct a test on an electronic device 20 in a state it became ready for the test before reaching the final step, the test has to be conducted while the electronic devices 20 are in an arrangement loaded on the electronic device conveying medium 10, furthermore, the arrangement of the electronic devices 20 loaded on the electronic device conveying medium 10 has to be kept to be conveyed to the next step.

Also, contact portions 110a of a test head of the conventional electronic device testing apparatus composed only one contact group 110 composed of the contact portions 110a by the number measured at a time limited in the electronic device testing apparatus as shown in FIG. 17 and FIG. 18.

FIG. 17 shows one contact group 110 configured that the number of the contact portions 110a is limited to 32, and FIG. 18 shows one contact group 110 configured that the number of the contact portions 110a is limited to 64.

Therefore, for example, when securing test positions with the simultaneously measured number of 32 for the electronic devices 20 to be tested loaded on the electronic device conveying medium 10 (rectangular shaped electronic devices arranged in 3 rows by 16 columns in the case of this example) shown in FIG. 19, it is possible to secure test positions of 32 at the first test (Post-tested electronic devices 21 in FIG. 19 show all of 32 black squares in the figure.), while only remaining 16 test positions can be secured (Pre-test electronic devices 22 in FIG. 19 show all of 16 white squares in the figure.) at the second test. Thus, only half the number of the 32 contact portions is used in the second test, so that there was a disadvantage that the test efficiency declines.

Also, when always securing the simultaneously measured number of 32 regularly on the electronic device conveying medium 10 having an arbitrary arrangement of the electronic devices 20, it is considered, for example, one contact group 110 composed of 32 contact portions 110a are divided to 32 contact groups, and 32 electronic device conveying media 10 are conveyed at a time to conduct a test on electronic devices to be tested 20 loaded on the electronic device conveying media 10 at a time. In this case, there is a disadvantage that the apparatus becomes huge and complicated, so that it is more preferable to secure the simultaneously measured number with as few electronic device conveying media 10 as possible.

The present invention was made in consideration of the above problems of the prior art and has as an object thereof to provide an electronic device testing apparatus capable of conducting a test with a high test efficiency on electronic devices 20 on an electronic device conveying media 10 by any number and in an arrangement thereof.

DISCLOSURE OF THE INVENTION

To attain the above object, an electronic device testing apparatus of the present invention is an electronic device testing apparatus for conducting a test by pressing input/output terminals of electronic devices to be tested against contact portions of a test head using a moving means while holding the electronic devices to be tested on an electronic device conveying medium, comprising a test head provided with a plurality of contact groups made by a set of contact portions; and a moving means capable of independently controlling the electronic device conveying medium loaded with the electronic devices to be tested to the contact groups.

In the electronic device testing apparatus of the present invention, a test is not conducted on devices on an electronic device conveying medium by using one contact groups made by the simultaneously measured number of contact portions, but as a result of providing a plurality of contact groups, as far as the total number of the contact portions in the electronic device testing apparatus matches with the simultaneously measured number limited in the electronic device testing apparatus, it is possible to optimally determine the number of contact groups, the number of contact portions in each of the contact groups and the arrangement.

Also, as a result that each of the contact groups has a moving means capable of separately controlling the electronic device conveying medium, the contact group can be operated without being affected by the progress of the operation of other contact groups, the simultaneously measured number limited in the electronic device testing apparatus can be always secured, and a high testing efficiency can be realized.

The electronic device conveying medium of the present invention includes all media for loading electronic devices to be tested.

For example, in the electronic device testing apparatus as set forth in claim 2, the electronic device conveying medium is a strip format or a wafer. Particularly, when conducting a test on electronic devices on a wafer, a high testing efficiency is realized in a test near the outer circumference where test positions by the simultaneously measured number are hard to be secured.

Also, the electronic device testing apparatus of the present invention is an electronic device testing apparatus as set forth in claim 1 or 2 comprising a control means for finishing tests with the shortest time on remaining the electronic devices to be tested on the electronic device conveying medium when a lot of the electronic devices to be tested finishes. For example, in the case where the electronic device conveying medium loaded with the electronic devices to be tested is already on the contact group when a lot of the electronic devices to be tested finishes, the control means suspends a test on the electronic devices to be tested already under the test in the contact group and outputs an instruction to move the electronic device conveying medium loaded with the electronic devices to be tested to other contact group already finished with tests and having a large number of contact portions.

In the case where the number of contact portions of a contact group having remaining tests is less than that of other contact groups when a lot of the electronic devices to be tested finishes, a test on the contact group of the electronic devices to be tested already under the test is suspended, and the electronic device conveying medium loaded with the electronic devices to be tested is controlled to be moved to other contact group finished with tests and having a large number of contact portions, so that the remaining test time when a lot of the electronic devices to be tested finishes can be reduced.

Also, the control means outputs an instruction for determining to which contact group the electronic device conveying medium loaded with remaining the electronic devices to be tested yet to be supplied to any contact group when a lot of said electronic devices to be tested finishes should be supplied, based on the number of electronic devices to be tested on the electronic device conveying medium, the number of contact portions in respective contact groups, and standby time until a test.

When a lot of the electronic devices to be tested are finished, by not to supply remaining electronic device conveying media yet to be supplied to the contact group, but to determine a contact group for supplying based on the number of electronic devices on the electronic device conveying medium, the number of contact portions of each of the contact groups, and standby time until a test, the remaining test time when a lot of the electronic devices to be tested finishes can be reduced.

According to the present invention explained above, as a result that one test head has a plurality of contact groups, and each of the contact groups has moving means capable of separately controlling an electronic device conveying medium, as far as the total number of contact portions in the electronic device testing apparatus matches with the simultaneously measured number limited in the electronic device testing apparatus, the number of the contact groups, the number of contact portions in each of the contact groups and an arrangement thereof can be optimally determined.

As a result, each of the contact groups can be operated without being affected by the progress of operations of other contact groups, the simultaneously measured number limited in the electronic device testing apparatus can be always secured for electronic devices to be tested on the electronic device conveying medium in an arbitrary arrangement, and a high testing efficiency can be realized.

BRIEF DESCRIPTION OF DRAWINGS

FIG. 16(a) to FIG. 16(h) are views showing examples of arbitrary arrangements on an electronic device conveying medium: wherein FIG. 16(a) shows an arrangement of electronic devices conveying medium loaded with electronic devices to be tested in an arrangement of 4 rows by 24 columns, FIG. 16(b) shows 3 rows by 20 columns, FIG. 16(c) shows 3 rows by 16 columns, FIG. 16(d) shows 3 rows by 12 columns, FIG. 16(e) shows 2 rows by 16 columns, FIG. 16(f) shows 2 rows by 12 columns, FIG. 16(g) shows 4 rows by 8 columns, and FIG. 16(h) shows 2 rows by 18 columns.

BEST MODE FOR CARRYING OUT THE INVENTION

Below, preferred embodiments of the present invention will be explained based on the drawings.

Embodiment 1

Figure 1:
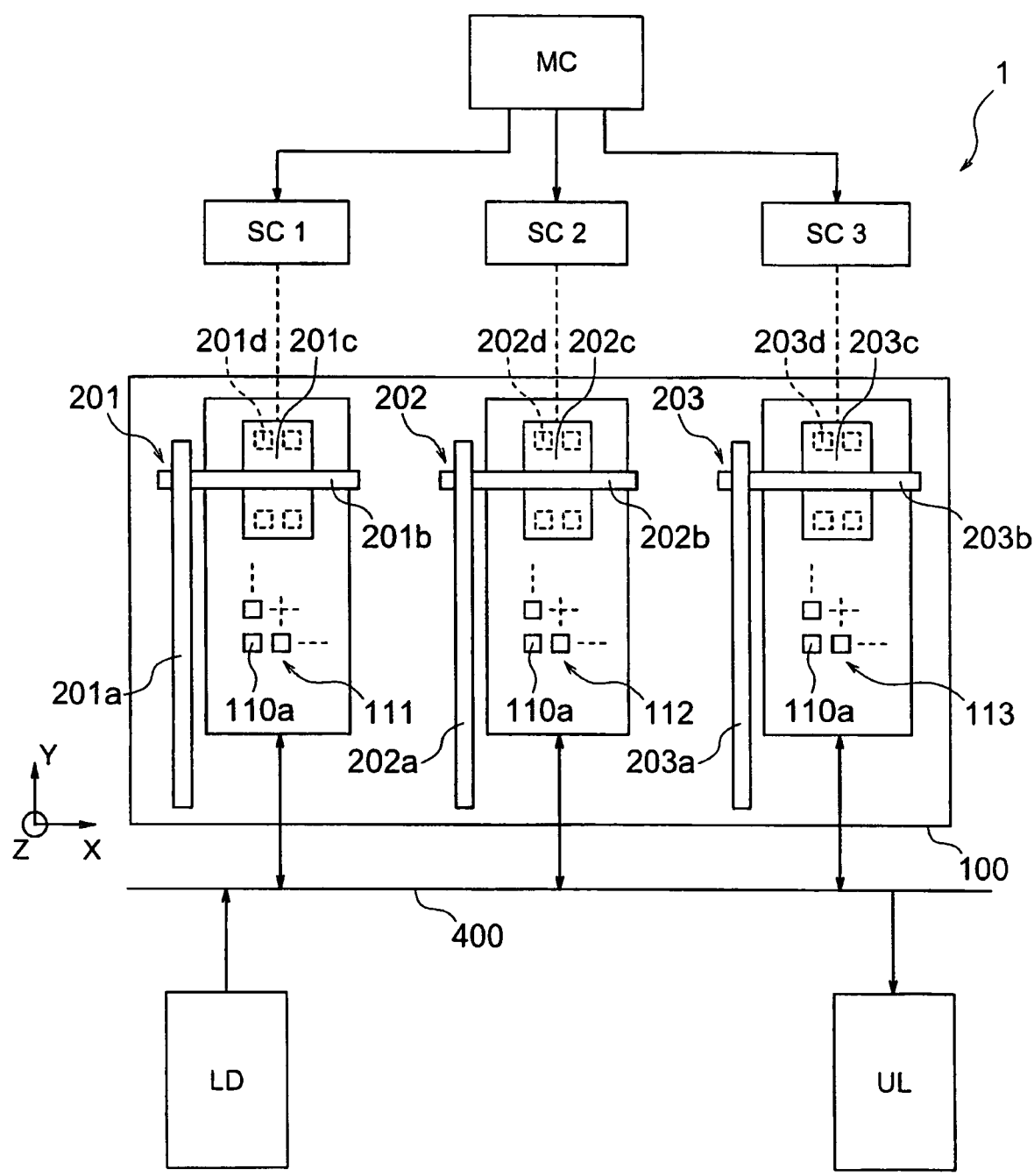
FIG. 1 is a view showing a schematic view of a first embodiment of the present invention and the control system.

FIG. 1 is a view showing a schematic view showing an electronic device testing apparatus 1 in the first embodiment of the present invention and the control system.

The electronic device testing apparatus 1 of the present embodiment is an apparatus for conducting a test (inspection) of whether electronic devices 20 operate suitably in a state wherein the electronic devices to be tested 20 are applied with a thermal stress of a high temperature or low temperature, and classifying the electronic devices 20 in accordance with the test results; wherein an operation test in a state of applying such thermal stresses is conducted by conveying an electronic device conveying medium 10 loaded with the electronic devices 20 to be tested as test objects to the electronic device testing apparatus 1.

Therefore, the electronic devices testing apparatus 1 of the present embodiment comprises a loader section LD for supplying electronic device conveying medium 10 loaded with pre-test electronic devices to a test 20 head portion 100 as shown in FIG. 1, a test head portion 100 composed of a plurality of contact groups (for example, expressed by three contact groups 111, 112 and 113 in FIG. 1) and moving devices (for example, expressed by three moving devices 201, 202 and 203 in FIG. 1) separately attached to them, and an unloader section UL for taking out by classifying the post-tested electronic devices 20 after being tested in the test head portion 100. Note that the configurations of the loader section LD and the unloader section UL are not particularly limited.

Loader Section LD

The loader section LD supplies an electronic device conveying medium (a strip format 10 in this example) loaded with the electronic devices to be tested 20 supplied from the previous step to the test head portion 100 composed of contact groups 111, 112 and 113 via a conveying means 400.

The configuration of the conveying means 400 is not particularly limited but, for example, is a means capable of moving a grip head for gripping the electronic device conveying medium 10 and the gripped electronic device conveying medium 10 in the X-Y-Z axes directions.

In FIG. 1, there is only one conveying means 400 for three contact groups. This configuration is advantageous in terms of capital investment and an occupying area of a facility when conducting a test on electronic devices 20 requiring a relatively long test time, etc. On the other hand, by providing respectively independent conveying means to the contact groups 111, 112 and 113, a standby state can be reduced in any of the contact groups 111, 112 and 113, and the index time can be reduced.

Furthermore, in FIG. 1, conveying means 400 from the loader section LD to the respective contact groups 111, 112 and 113 and the conveying means 400 from the respective contact groups 111, 112 and 113 to the unloader section UL are a common conveying means. However, when conducting tests on electronic devices 20 requiring a relatively short test time, by providing an independent conveying means respectively to the loader section LD and the unloader section UL, the standby state of the contact groups 111, 112 and 113 can be reduced, and the index time can be reduced.

Note that a method of providing a loader section and an unloader section separately to each of the contact groups 111, 112 and 113.

Test Head Section 100

The electronic device conveying medium 10 is supplied from the loader section LD to the test head section 100 via the conveying means 400, and a test is conducted while electronic devices 20 are loaded on the electronic device conveying medium 10.

The test head section 100 comprises three contact groups, that is a first contact group 111, a second contact group 112, and a third contact group 113, for conducting a test on electronic devices 20 arranged on the electronic device conveying medium 10 supplied from the loader section LD; and three moving devices, that is a first moving device 201, a second moving device 202 and a third moving device 203, for controlling a position and posture of the electronic device conveying medium 10 corresponded to one for each of the contact groups.

The first moving device 201 is a means for controlling a position of an electronic device conveying medium 10 in the X-Y-Z axes directions and controlling a posture in the θ angle direction by using the Z-axis as a center axis. It is configured, for example, by rails 201a provided along the Y-axis direction, a movable arm 201b for moving in the Y-axis direction on the rail 201a, and a movable head 201c supported by the movable arm 201b and capable of moving in the X-axis direction along the movable arm 201b, so as to be able to move in a region above the first contact group 111. Furthermore, the movable head 201c is movable also in the Z-axis direction (that is, in the vertical direction) by a not shown Z-axis actuator, and a not shown posture control function enables adjustment of the θ angle by using the Z-axis as a center axis. The plurality of grip heads 201d provided to the movable head 201c (for example, four suction heads) enables to grip, convey and release one electronic device conveying medium 10 at a time.

One electronic device 20 to be tested loaded on the electronic device conveying medium 10 corresponds to one contact portion 110a, each electronic device 20 loaded on the electronic device conveying medium 10 gripped by the grip head 201d is applied with a suitable pressure by movement of the movable head 201c in the Z-axis downward direction, and a test is conducted by being brought to contact a not shown contact pin on the contact portion 110a. The test result is stored, for example, at an address determined by an identification number attached to the electronic device conveying medium 10 and a number assigned to the electronic device 20 inside the electronic device conveying medium 10.

The first contact group 111 is composed of a set of contact portions 110a for conducting a test on the electronic devices 20, and configurations of the second contact group 112 and the third contact group 113 are composed of a set of contact portions 110a in the same way.

Figure 2:
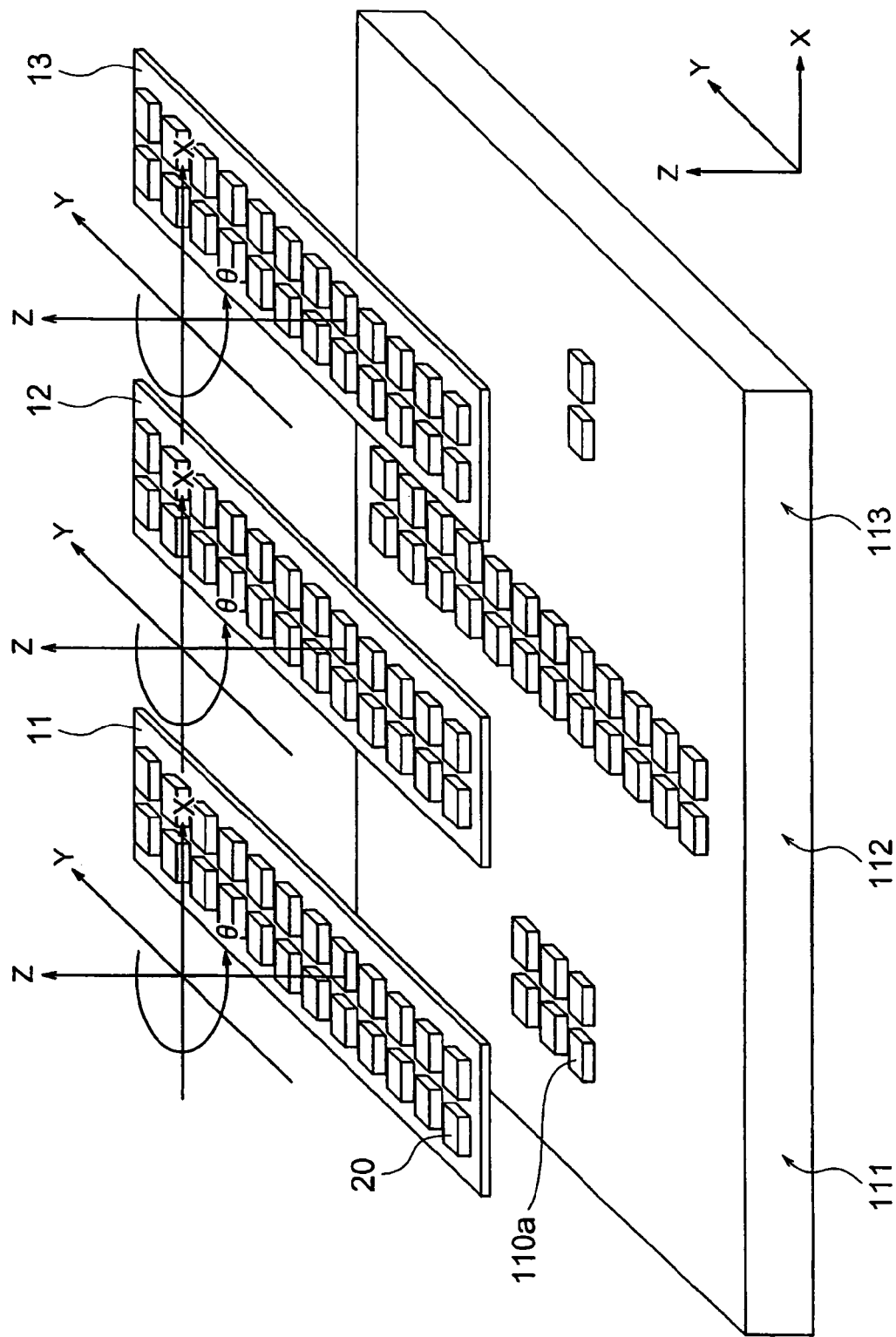
FIG. 2 is a schematic view of an operation of a strip format by an independent contact group and moving device.

The number and the arrangement of the contact portions 110a in each contact group can be optimally determined in accordance with the number of electronic devices 20 on the electronic device conveying medium 10, the arbitrary arrangement and a production plan as far as the total number of the contact portions 110a in the electronic device testing apparatus 1 matches with the simultaneously measured number limited in the electronic device testing apparatus 1 (Normally, the simultaneously measured number is limited to $2^n$, such as 32 and 64. Note that the "n" is a natural number.). Namely, as far as the total number of the first contact group 111, the second contact group 112 and the third contact group 113 in FIG. 1 matches with 32 or 64 as the simultaneously measured number, the number and the arrangement of the contact portions 110a in the contact group can be freely set. In FIG. 2, the first contact group 111 is provided with 6 contacts, the second contact group 112 is provided with 24 contacts, and the third contact group 113 is provided with 2 contacts, and the total number 32 of these contact portions 110a matches with the limited simultaneously measured number of 32. Also, pitches between the respective contact portions 110a in the contact group are in the relationship of being identical with a multiple (including 1) of pitches between respective electronic devices 20 arranged on the electronic device conveying medium 10 corresponding to the respective contact groups 111, 112 and 113.

Furthermore, the number of contact group in the electronic device testing apparatus 1 can be optimally determined in accordance with the number, the arrangement and production plan of the electronic devices 20 to be tested on the electronic device conveying medium 10 and, as shown as an example in FIG. 2, the first contact group 111 is provided to be correspondent to the first electronic device conveying medium 11, the second contact group 112 is provided to be correspondent to the second electronic device conveying medium 12, and the third contact group 113 is provided to be corresponding to the third electronic device conveying medium 13, and the number of the contact groups in this case is three.

Also, to prevent the respective contact groups from being affected by the progress of other operations, the first contact group 111 is provided with a first moving device 201 being independent from other moving devices, the second contact group 112 is provided with a second moving device 202 being independent from other moving devices, and the third contact group 113 is provided with a third moving device 203 being independent from other moving devices, so that mutually independent operations can be performed.

Note that the basic configuration and operation of the second moving device 202 are the same as those of the first moving device 201 explained above. It is configured to be able to move in a region above the second contact group 112 by rails 202a provided along the Y-axis direction, a movable arm 202b movable in the Y-axis direction on the rail 202a, and a movable head 202c supported by the movable arm 202b and movable in the X-axis direction along the movable arm 202b. Furthermore, the movable head 202c is movable also in the Z-axis direction (namely, in the vertical direction) by a not shown Z-axis actuator, and adjustment of the θ angle by using the Z-axis as a center axis is possible by a not shown posture control function. A plurality of grip heads 202d (for example, four suction heads) provided to the movable head 202c enables to grip, convey and release one electronic device conveying medium 10 at a time.

Also, the basic configuration and operation of the third moving device 203 are the same as those of the first moving device 201 explained above. It is configured to be able to move in a region above the third contact group 113 by rails 203a provided along the Y-axis direction, a movable arm 203b movable in the Y-axis direction on the rail 203a, and a movable head 203c supported by the movable arm 203b and movable in the X-axis direction along the movable arm 203b. Furthermore, the movable head 203c is movable also in the Z-axis direction (namely, in the vertical direction) by a not shown Z-axis actuator, and adjustment of the θ angle by using the Z-axis as a center axis is possible by a not shown posture control function. A plurality of grip heads 203d (for example, four suction heads) provided to the movable head 203c enables to grip, convey and release one electronic device conveying medium 10 at a time.

On an upper portion of FIG. 1 shows an outline of a control system of the electronic device testing apparatus 1, and the control system comprises a main controller MC, a first sub controller SC1, a second sub controller SC2, and a third sub controller SC3.

The main controller MC collectively manages the first sub controller SC1, the second sub controller SC2 and the third sub controller SC3 to perform control in the Z-axis direction for tests on the first moving device 201, control in the Z-axis direction for tests on the second moving device 202, control in the Z-axis direction for tests on the third moving device, and control of outputting a start request signal to the first contact group 111, the second contact group 112 and the third contact group 113. As a result, test timings in the first contact group 111, the second contact group 112 and the third contact group 113 can be synchronized, and the simultaneously measured number can be secured.

Furthermore, the first sub controller SC1 performs control of moving in the X-Y-Z directions of the first moving device 201 excepting for those performed by the main controller MC, the second sub controller SC2 performs control of moving in the X-Y-Z directions of the second moving device 202 excepting for those performed by the main controller MC, the third sub controller SC3 performs control of moving in the X-Y-Z directions of the third moving device 203 excepting for those performed by the main controller MC. Consequently, the three moving devices can be controlled independently from one another.

In the above example, the explanation was made in premise of setting three contact groups, thus, three moving devices were explained. But it is not limited to this and the number of contact groups 110 in the electronic device testing apparatus 1 and the number and arrangement of contact portions 110a in each contact group 110 can be freely set in accordance with the number and arrangement of electronic devices 20 to be tested on the electronic device conveying medium 10 (for example, two contact groups 110 or four or more contact groups), and the number of the mutually independent moving devices can be set in accordance with the number of the contact groups 110. Note that when the number of the contact groups 110 increases, an occupying area of the test head portion 100 also increases, so that the number of the contact group 110 is determined by considering the test efficiency and the occupying area.

Unloader Section UL

The unloader section UL is provided with a conveyor means 400 in common with that in the loader section LD. The electronic device conveying media 10 loaded with the electronic devices 20 tested in the first contact group 111, second contact group 112 and the third contact group 113 are discharged from the test head portion 100 via the conveyor means 400.

In the same way as in the loader section LD, in FIG. 1, while only one conveyor means 400 is illustrated for the first contact group 111, second contact group 112, the third contact group 113 and the loader section LD, the index time can be reduced, for example, by providing a plurality of conveyor means in the same way as in the loader section LD.

Next, the operation will be explained.

The electronic device conveying media 10 loaded with the electronic devices 20 to be tested supplied from the loader section LD are tested by the first contact group 111, second contact group 112 and the third contact group 113. Below, a specific test method in the case of examples with the simultaneously measured number of 32 and of 64 will be explained.

Figure 3:
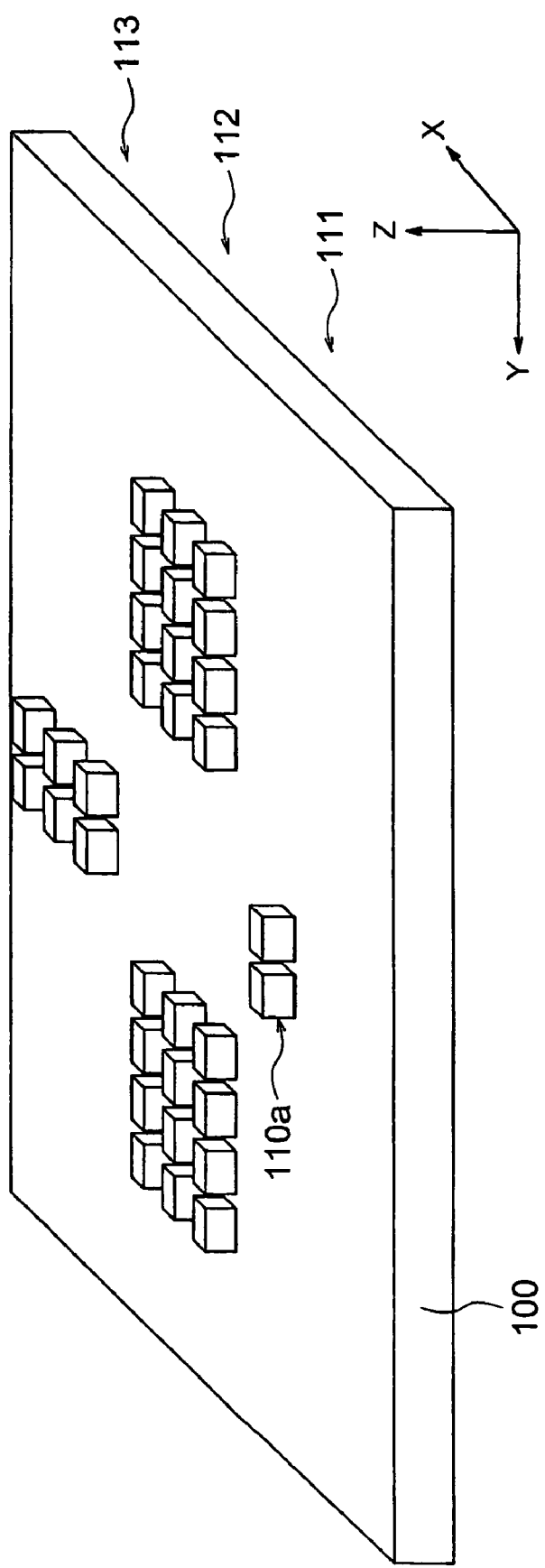
FIG. 3 is an example 1 of an arrangement of a contact group in the case of measuring 32 at a time.

FIG. 3 shows an example of three contact groups in the case with the simultaneously measured number of 32, that is, the first contact group 111, second contact group 112 and the third contact group 113 are set and the numbers of the contact portions 110a in the respective contact groups are 2 in the first contact group 111, 24 in the second contact group 112, and 6 in the third contact group 113.

Figure 4:
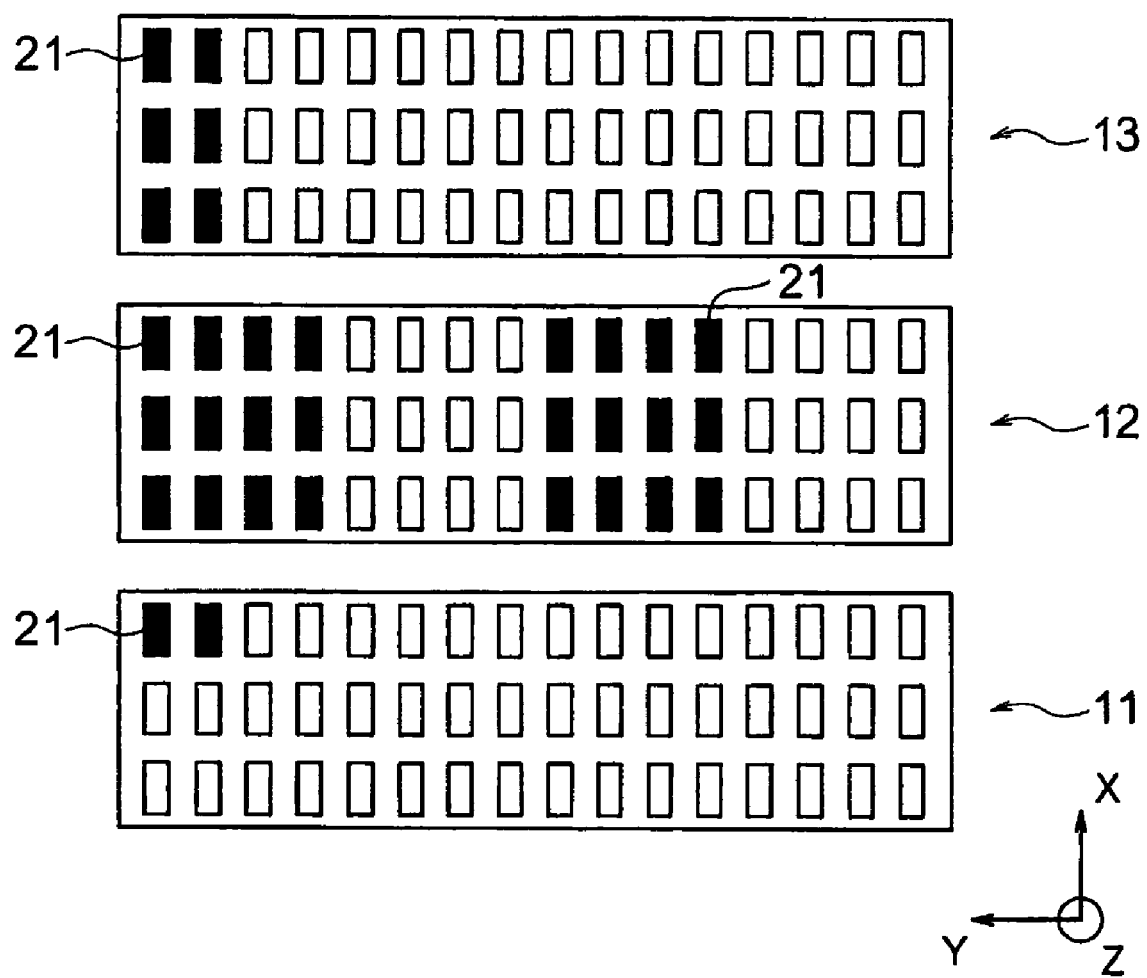
FIG. 4 is a view showing test positions in the first round test of an arrangement of the electronic devices to be tested on an electronic device conveying medium corresponding to FIG. 3.

FIG. 4 shows first test positions 21 (The first test positions 21 indicate all black squares in the figure. It is the same in FIG. 6, FIG. 8 and FIG. 10 below.) of arranged electronic devices 20 on the electronic device conveying medium 10 corresponding to FIG. 3, wherein the first electronic device conveying medium 11 loaded with electronic devices 20 to be tested in the first contact group 111, the second electronic device conveying medium 12 loaded with electronic devices 20 to be tested in the second contact group 112, and the third electronic device conveying medium 13 loaded with electronic devices 20 to be tested in the third contact group 113 are shown, respectively.

The first electronic device conveying medium 11 supplied from the loader section LD via the conveyor means 400 is moved to a region above the first contact group 111 by the first moving device 201.

Next, electronic devices 20 to be tested at the first row on the first column and first row on the second column arranged on the first electronic device conveying medium 11 in FIG. 4 are moved to above the first contact group 111, and the two electronic devices 20 at the first row on the first column and first row on the second column on the arrangement on the electronic device conveying medium 11 are tested in the first round.

When the test is finished, the movable head 201c having a grip head 201d gripping the electronic device conveying medium 11 elevates, then, moves in the X-axis direction by an amount of one row, and two electronic devices 20 at the second row on the first column and at the second row on the second column are tested in the second round.

When the test is finished, the movable head 201c gripping the electronic device conveying medium 11 elevates, then, moves in the X-axis direction by an amount of one row, and two electronic devices 20 at the third row on the first column and at the third row on the second column are tested in the third round.

When the test is finished, the movable head 201c gripping the electronic device conveying medium 11 elevates, then, moves in the Y-axis direction by an amount of two columns, and two electronic devices 20 at the third row on the third column and at the third row on the fourth column are tested in the fourth round.

When the test is finished, the movable head 201c gripping the electronic device conveying medium 11 elevates, then, moves in the X-axis direction by an amount of one row, and two electronic devices 20 at the second row on the third column and at the second row on the fourth column are tested in the fifth round.

When the test is finished, the movable head 201c gripping the electronic device conveying medium 11 elevates, then, moves in the X-axis direction by an amount of one row, and two electronic devices 20 at the first row on the third column and on the first row on the fourth column are tested in the sixth round.

Below, tests are conducted on two electronic devices 20 in the same order, and tests are conducted for 24 times in total for one electronic device conveying medium 11. After completing tests of 24 rounds in total, the electronic device conveying medium 11 is discharged by the conveying means 400 to the unloader section UL, and a next electronic device conveying medium 11 is supplied from the loader section LD by the conveying means 400.

The electronic device conveying medium 12 supplied from the loader section LD via the conveying means 400 is moved to a region above the second contact group 112 by the moving device 202.

Next, electronic devices 20 to be tested in a range from the first row on the first column to the third row on the fourth column and a range from the first row on the ninth column to third row on the twelfth column arranged on the second electronic device conveying medium 12 in FIG. 4 are moved to above the second contact group 112, and twenty-four electronic devices 20 in the range from the first row on the first column to the third row on the fourth column and the range from the first row on the ninth column to third row on the twelfth column are tested in the first round.

When the test is finished, the movable head 202c having a grip head 202d gripping the electronic device conveying medium 12 elevates, then, moves to the Y-axis direction by an amount of 4 columns, and twenty-four electronic devices 20 in a range from the first row on the fifth column to the third row on the eighth column and a range from the first row on the thirteenth column to third row on the sixteenth column are tested in the second round. Tests are conducted for two times in total for one electronic device conveying medium 12. After completing the tests for two times in total, it is discharged by the conveying means 400 to the unloader section UL, and a next electronic device conveying medium 12 is supplied from the loader section LD via the conveying means 400.

Note that when applying an arrangement of contact portions 110a as in the second contact group 112 to an electronic device conveying medium with an arrangement as in the electronic device conveying medium 12, a moving method below being different from that explained above is considered.

The second electronic device conveying medium 12 supplied from the loader section LD via the conveying means 400 is moved to a region above the second contact group 112 by the second moving device 202.

Next, electronic devices 20 to be tested in a range from the first row on the first column to the third row on the fourth column and a range from the first row on the ninth column to third row on the twelfth column arranged on the second electronic device conveying medium 12 in FIG. 4 are moved to above the second contact group 112, and twenty-four electronic devices 20 in the range from the first row on the first column to the third row on the fourth column and the range from the first row on the ninth column to third row on the twelfth column of the arrangement on the electronic device conveying medium 12 are tested at a time in the first round.

When the test is finished, a method is also considered that the movable head 202c having a grip head 202d gripping the electronic device conveying medium 12 elevates, then, rotates to the θ angle direction about the Z-axis by 180 degrees, and 24 electronic devices 20 in a range from the first row on the fifth column to the third row on the eighth column and a range from the first row on the thirteenth column to third row on the sixteenth column are tested in the second round.

The third electronic device conveying medium 13 supplied from the loader section LD by the conveying means 400 is moved to a region above the third contact group 113 by the third moving device 203.

Next, electronic devices 20 in a range from the first row on the first column to the third row on the second column arranged on the third electronic device conveying medium 13 in FIG. 4 are moved to above the third contact group 113, and six electronic devices 20 in the range from the first row on the first column to the third row e on the second column of the arrangement on the electronic device conveying medium 13 are tested in the first round.

When the test is finished, the movable head 203c having a grip head 203d gripping the electronic device conveying medium 13 elevates, then, moves to the Y-axis direction by an amount of 2 columns, and six electronic devices 20 in a range from the first row on the third column to the third row on the fourth column are tested in the second round.

Below, six electronic devices 20 are tested in the same order, and tests are conducted for eight times in total for one electronic device conveying medium 13. After completing the tests for eight times in total, it is discharged by the conveying means 400 to the unloader section UL, and a next electronic device conveying medium 13 is supplied from the loader section LD via the conveying means 400.

Accordingly, until the tests on one electronic device conveying medium 11 in the first contact group 111 are finished, tests on twelve electronic device conveying media 12 are finished in the second contact group 112, and tests on three electronic device conveying media 13 are finished in the third contact group 113.

Note that timing of tests of the first moving device 201, timing of tests of the second moving device 202, and timing of tests of the third moving device 203 are synchronized in the first moving device 201, the second moving device 202 and the third moving device 203 by the main controller MC, and tests are conducted at the same timing.

Also, by independently controlling the three moving devices 201, 202 and 203 by the sub controllers SC1, SC2 and SC3, it is possible to always secure the simultaneously measured number of 32 limited in the electronic device testing apparatus 1 on an arbitrary arrangement of the electronic devices 20 on the electronic device conveying medium 10, and a high test efficiency can be realized.

Figure 5:
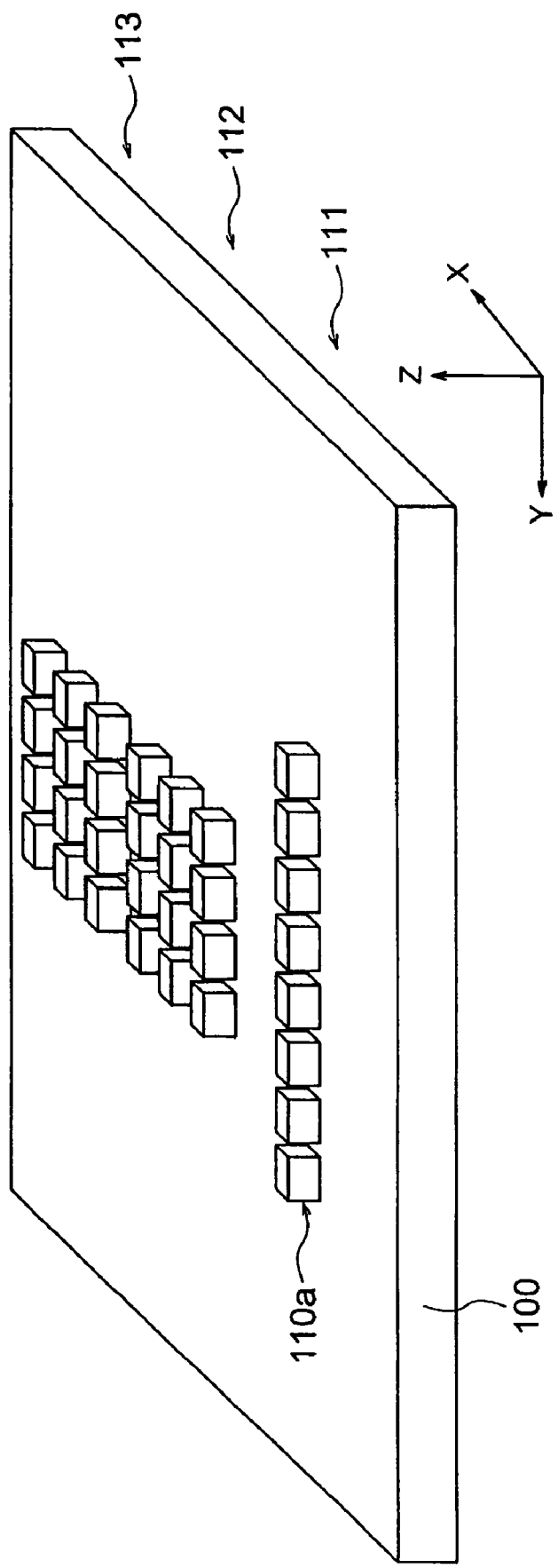
FIG. 5 is an example 2 of an arrangement of a contact group in the case of measuring 32 at a time.

FIG. 5 is another embodiment in the case of the simultaneously measured number of 32 and shows an example wherein the numbers of contact portions 110a in the respective contact groups are set to be 8 in the first contact group 111, 12 in the second contact group 112 and 12 in the third contact group 113.

Figure 6:
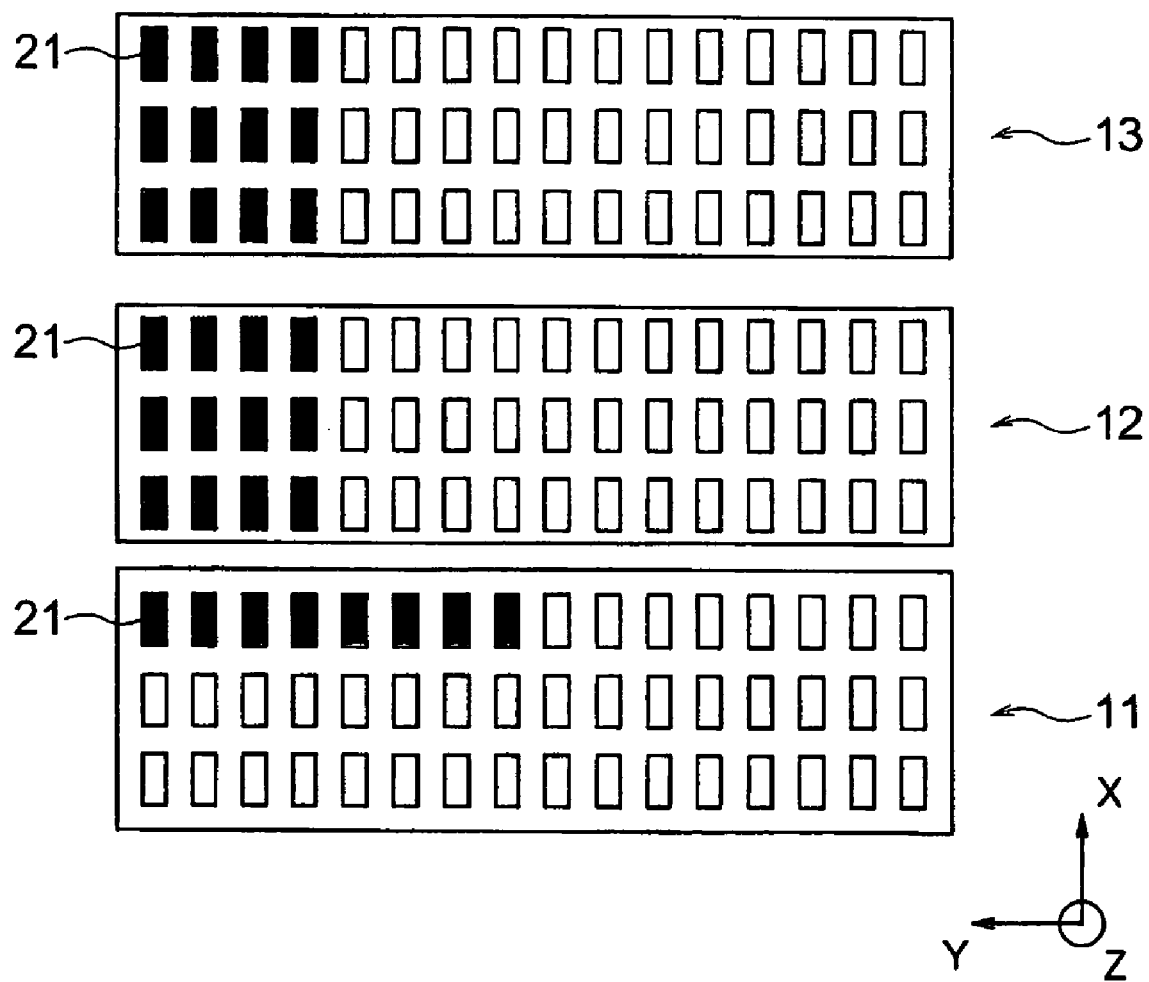
FIG. 6 is a view showing the test positions in the first round test of an arrangement of electronic devices to be tested on an electronic device conveying medium corresponding to FIG. 5.

FIG. 6 shows first test positions 21 of electronic devices 20 arranged on the electronic device conveying medium 10 corresponding to FIG. 5, wherein the first electronic device conveying medium 11 loaded with electronic devices 20 to be tested in the first contact group 111, the second electronic device conveying medium 12 loaded with electronic devices 20 to be tested in the second contact group 112, and the third electronic device conveying medium 13 loaded with electronic devices 20 to be tested in the third contact group 113 are shown, respectively.

The first electronic device conveying medium 11 supplied from the loader section LD via the conveying means 400 is moved to a region above the first contact group 111 by the first moving device 201.

Next, electronic devices 20 to be tested in a range from the first row on the first column to the first row to the eighth column arranged on the first electronic device conveying medium 11 in FIG. 6 are moved to above the first contact group 111, and 8 electronic devices 20 in the range from the first row on the first column to the first row to the eighth column of the arrangement on the electronic device conveying medium 11 are tested in the first round.

When the test is finished, the movable head 201c having a grip head 201d gripping the first electronic device conveying medium 11 elevates, then, moves to the X-axis direction by an amount of one row, and 8 electronic devices 20 in a range from the second row on the first column to the second row on the eighth column are tested in the second round.

When the test is finished, the movable head 201c gripping the electronic device conveying medium 11 elevates, then, moves to the X-axis direction by an amount of one row, and 8 electronic devices 20 in a range from the third row on the first column to the third row on the eighth column are tested in the third round.

When the test is finished, the movable head gripping the electronic device conveying medium 11 elevates, then, moves to the X-axis direction by an amount of one row and to the Y-axis direction by an amount of eight columns, and 8 electronic devices 20 in a range from the second row on the ninth column to the second row on the sixteenth column are tested in the fourth round.

When the test is finished, the movable head 201c gripping the electronic device conveying medium 11 elevates, then, moves to the X-axis direction by an amount of one row, and 8 electronic devices 20 in a range from the third row on the ninth column to the third row on the sixteenth column are tested in the fifth round.

When the test is finished, the movable head 201c gripping the electronic device conveying medium 11 elevates, then, moves to the X-axis direction by an amount of two rows, and 8 electronic devices 20 in a range from the first row on the ninth column to the first row on the sixteenth column are tested in the sixth round.

Tests are conducted for six times in total for one electronic device conveying medium 11. After completing the tests for six times in total, it is discharged by the conveying means 400 to the unloader section UL, and a next electronic device conveying medium 11 is supplied from the loader section LD via the conveying means 400.

The second electronic device conveying medium 12 supplied from the loader section LD via the conveying means 400 is moved to a region above the second contact group 112 by the second moving device 202.

Next, electronic devices to be tested 20 in a range from the first row on the first column to the third row on the fourth column arranged on the second electronic device conveying medium 12 in FIG. 6 are moved to above the second contact group 112, and 12 electronic devices 20 in the range from the first row on the first column to the third row on the fourth column of the arrangement on the electronic device conveying medium 12 are tested in the first round.

When the test is finished, the movable head 202c having a grip head 202d gripping the electronic device conveying medium 12 elevates, then, moves to the Y-axis direction by an amount of four columns, and 12 electronic devices 20 in a range from the first row on the fifth column to the third row on the eighth column are tested in the second round.

Below, 12 electronic devices 20 are tested in the same order, and tests are conducted for four times in total for one electronic device conveying medium 12. After completing the tests for four times in total, it is discharged by the conveying means 400 to the unloader section UL, and a next electronic device conveying medium 12 is supplied from the loader section LD via the conveying means 400.

The third electronic device conveying medium 13 supplied from the loader section LD via the conveying means 400 is moved to a region above the third contact group 113 by the third moving device 203.

Next, electronic devices 20 to be tested in a range from the first row on the first column to the third row to the fourth column arranged on the electronic device conveying medium 13 in FIG. 6 are moved to above the third contact group 113, and 12 electronic devices 20 in the range from the first row on the first column to the third row to the fourth column of the arrangement on the electronic device conveying medium 13 are tested in the first round.

When the test is finished, the movable head 203c having a grip head 203d gripping the electronic device conveying medium 13 elevates, then, moves to the Y-axis direction by an amount of four columns, and 12 electronic devices 20 in the range from the first row on the fifth column to the third row on the eighth column are tested in the second round.

Below, 12 electronic devices 20 are tested in the same order, and tests are conducted for four times in total for one electronic device conveying medium 13. After completing the tests for four times in total, it is discharged by the conveying means 400 to the unloader section UL, and a next electronic device conveying medium 13 is supplied from the loader section LD via the conveying means 400.

Accordingly, until the tests on two electronic device conveying medium 11 in the first contact group 111 are finished, tests on three electronic device conveying media 12 are finished in the second contact group 112, and tests on three electronic device conveying media 13 are finished in the third contact group 113 by respectively independent moving devices.

Note that timing of tests of the first moving device 201, timing of tests of the second moving device 202, and timing of tests of the third moving device 203 are synchronized in the first moving device 201, the second moving device 202 and the third moving device 203 by the main controller MC, and tests are conducted at the same timing.

Also, by independently controlling the three moving devices 201, 202 and 203 by the sub controllers SC1, SC2 and SC3, it is possible to always secure the simultaneously measured number of 32 limited in the electronic device testing apparatus 1 on an arbitrary arrangement of electronic devices 20 on the electronic device conveying medium 10, and a high test efficiency can be realized.

Figure 7:
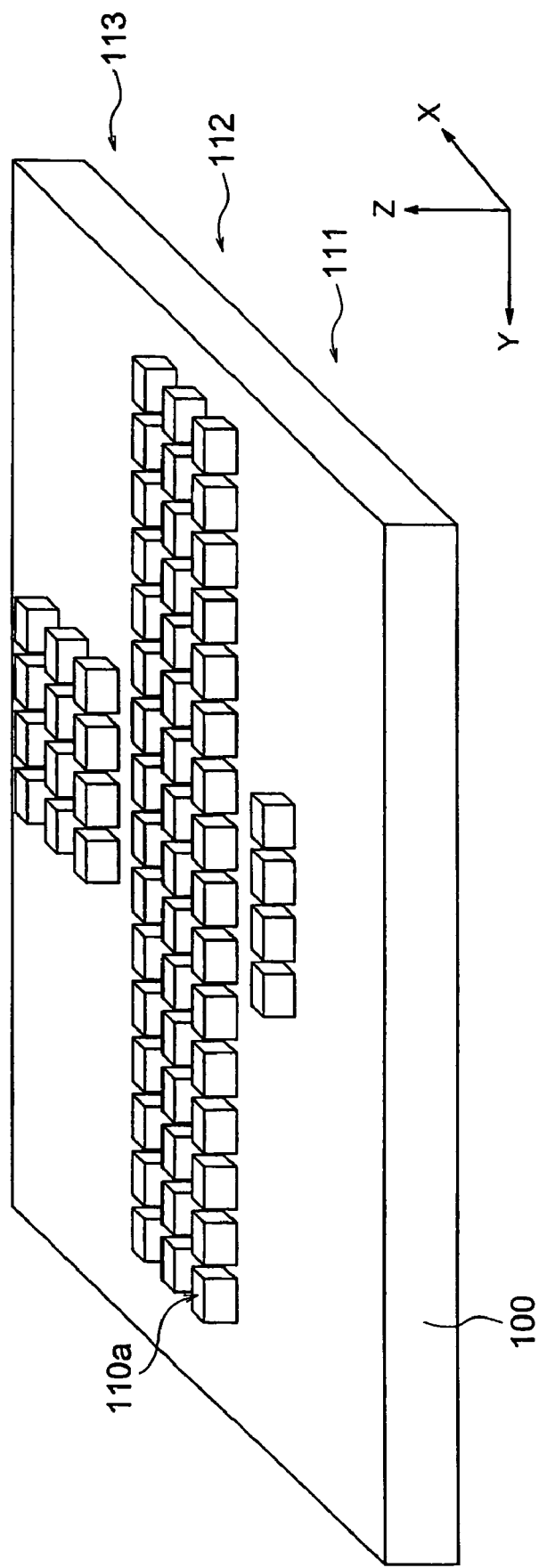
FIG. 7 is an example 1 of an arrangement of a contact group in the case of measuring 64 at a time.

FIG. 7 shows an example of setting three contact groups, that is the first contact group 111, the second contact group 112 and the third contact group 113, in the case of the simultaneously measured number of 64, wherein the numbers of contact portions 110a in the respective contact groups are set to be 4 in the first contact group 111, 48 in the second contact group 112 and 12 in the third contact group 113.

Figure 8:
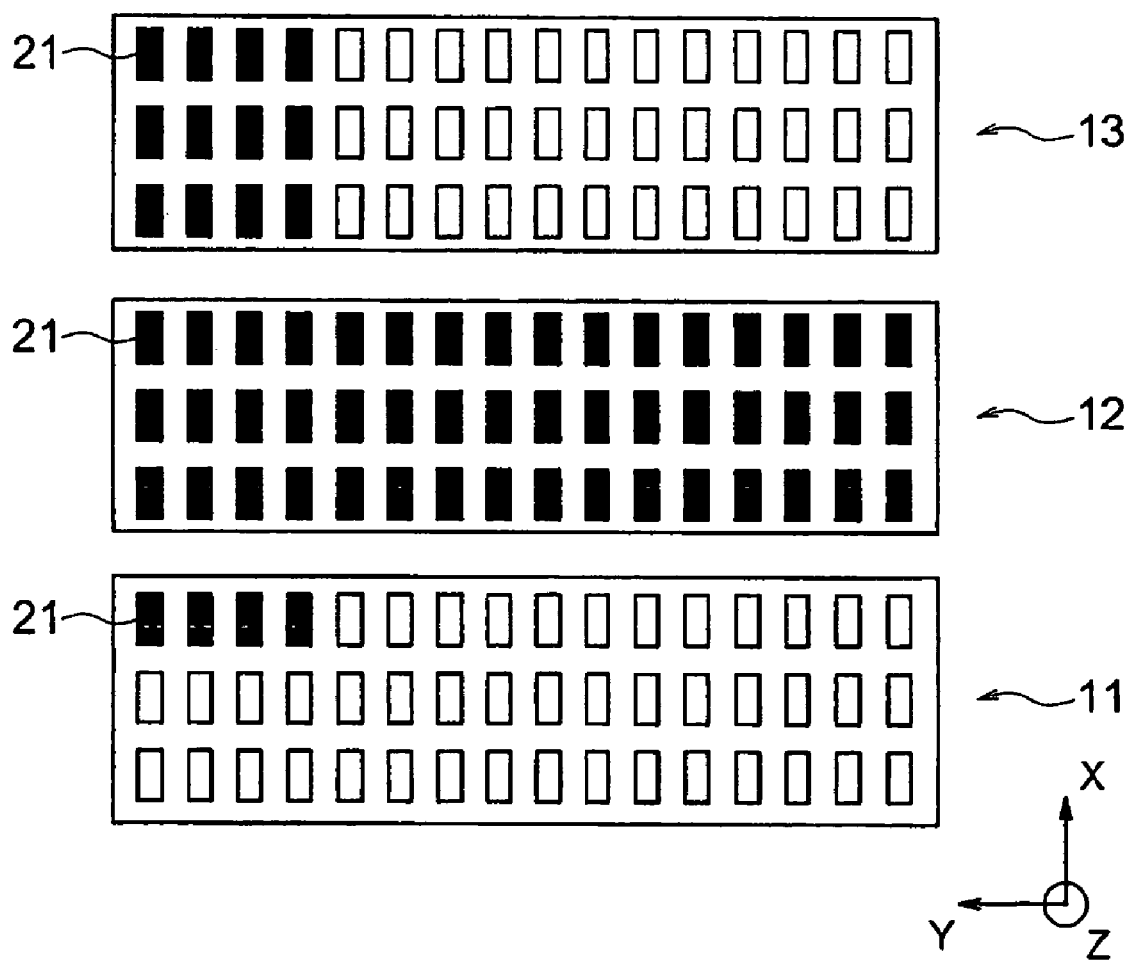
FIG. 8 is a view showing the test positions in the first round time of an arrangement of electronic devices to be tested on an electronic device conveying medium corresponding to FIG. 7.

FIG. 8 shows first test positions 21 of electronic devices 20 to be tested arranged on the electronic device conveying medium 10 corresponding to FIG. 7, wherein the first electronic device conveying medium 11 loaded with electronic devices 20 to be tested in the first contact group 111, the second electronic device conveying medium 12 loaded with electronic devices 20 to be tested in the second contact group 112, and the third electronic device conveying medium 13 loaded with electronic devices 20 to be tested in the third contact group 113 are shown, respectively.

The first electronic device conveying medium 11 supplied from the loader section LD via the conveying means 400 is moved to a region above the first contact group 111 by the first moving device 201.

Next, electronic devices to be tested 20 in a range from the first row on the first column to the first row to the fourth column arranged on the first electronic device conveying medium 11 in FIG. 8 are moved to above the first contact group 111, and 4 electronic devices 20 in the range from the first row on the first column to the first row to the fourth column of the arrangement on the electronic device conveying medium 11 are tested in the first round.

When the test is finished, the movable head 201c having a grip head 201d gripping the electronic device conveying medium 11 elevates, then, moves to the X-axis direction by an amount of one row, and 4 electronic devices 20 in a range from the second row on the first column to the second row on the fourth column are tested in the second round.

When the test is finished, the movable head 201c gripping the electronic device conveying medium 11 elevates, then, 4 electronic devices 20 in a range from the third row on the first column to the third row on the fourth column are tested in the third round.

When the test is finished, the movable head 201c gripping the electronic device conveying medium 11 elevates, then, moves to the Y-axis direction by an amount of four columns, and 4 electronic devices 20 in a range from the third row on the fifth column to the third row on the eighth column are tested in the fourth round.

When the test is finished, the movable head 201c gripping the electronic device conveying medium 11 elevates, then, moves to the X-axis direction by an amount of one row, and 4 electronic devices 20 in a range from the second row on the fifth column to the second row on the eighth column are tested in the fifth round.

When the test is finished, the movable head 201*c* gripping the electronic device conveying medium 11 elevates, then, moves to the X-axis direction by an amount of one row, and 4 electronic devices 20 in a range from the first row on the fifth column to the first row on the eighth column are tested in the sixth round.

Below, 4 electronic devices 20 are tested in the same order, and tests are conducted for 12 times in total for one electronic device conveying medium 11. After completing the tests for 12 times in total, it is discharged by the conveying means 400 to the unloader section UL, and a next electronic device conveying medium 11 is supplied from the loader section LD via the conveying means 400.

The second electronic device conveying medium 12 supplied from the loader section LD via the conveying means 400 is moved to a region above the second contact group 112 by the second moving device 202.

Next, electronic devices to be tested 20 in a range from the first row on the first column to the third row on the sixteenth column arranged on the second electronic device conveying medium 12 in FIG. 8 are moved to above the second contact group 112, and 48 electronic devices 20 in a range from the first row on the first column to the third row on the sixteenth column of the arrangement on the electronic device conveying medium 12, that is all electronic devices 20 on the electronic device conveying medium 12, are tested at a time.

After completing the test for one time in total, it is discharged by the conveying means 400 to the unloader section UL, and a next electronic device conveying medium 12 is supplied from the loader section LD via the conveying means 400.

The third electronic device conveying medium 13 supplied from the loader section LD via the conveying means 400 is moved to a region above the third contact group 113 by the third moving device 203.

Next, electronic devices to be tested 20 in a range from the first row on the first column to the third row on the fourth column arranged on the third electronic device conveying medium 13 in FIG. 8 are moved to above the third contact group 113, and 12 electronic devices 20 in a range from the first row on the first column to the third row on the fourth column of the arrangement on the electronic device conveying medium 13 are tested in the first round.

When the test is finished, the movable head 203*c* having a grip head 203*d* gripping the electronic device conveying medium 13 elevates, then, moves to the Y-axis direction by an amount of four columns, and 12 electronic devices 20 in a range from the first row on the fifth column to the third row on the eighth column are tested in the second round.

Below, 12 electronic devices 20 are tested in the same order, and tests are conducted for four times in total for one electronic device conveying medium 13. After completing the tests for four times in total, it is discharged by the conveying means 400 to the unloader section UL, and a next electronic device conveying medium 13 is supplied from the loader section LD via the conveying means 400.

Accordingly, until the tests on one electronic device conveying medium 11 in the first contact group 111 are finished, tests on twelve electronic device conveying media 12 are finished in the second contact group 112, and tests on three electronic device conveying media 13 are finished in the third contact group 113 by respectively independent moving devices.

Note that timing of tests of the first moving device 201, timing of tests of the second moving device 202, and timing of tests of the third moving device 203 are synchronized in the first moving device 201, the second moving device 202 and the third moving device 203 by the main controller MC, and tests are conducted at the same timing.

Also, by independently controlling the three moving devices 201, 202 and 203 by the sub controllers SC1, SC2 and SC3, it is possible to always secure the simultaneously measured number of 64 limited in the electronic device testing apparatus 1 on an arbitrary arrangement of electronic devices 20 on the electronic device conveying medium 10, and a high test efficiency can be realized.

Figure 9:
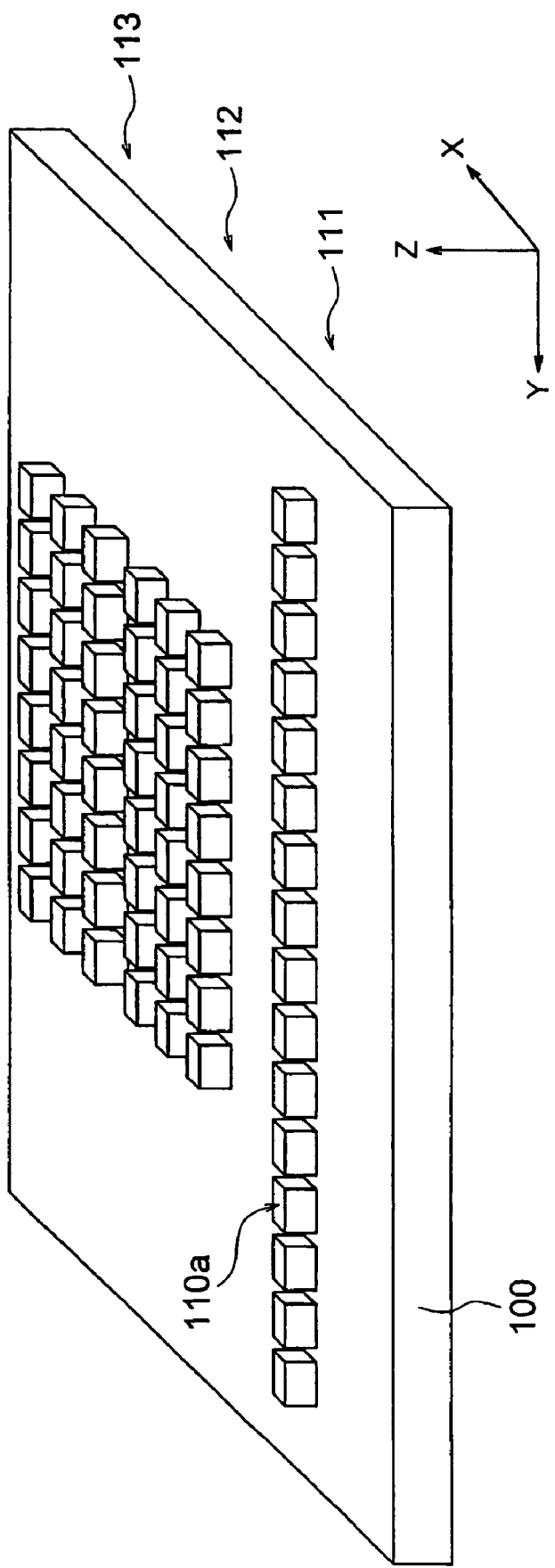
FIG. 9 is an example 2 of an arrangement of a contact group in the case of measuring 64 at a time.

FIG. 9 is another embodiment in the case of the simultaneously measured number of 64 and shows an example of the case of setting three contact groups, that is the first contact group 111, the second contact group 112 and the third contact group 113, wherein the numbers of contact portions 110*a* in the respective contact groups are set to be 16 in the first contact group 111, 24 in the second contact group 112 and 24 in the third contact group 113.

Figure 10:
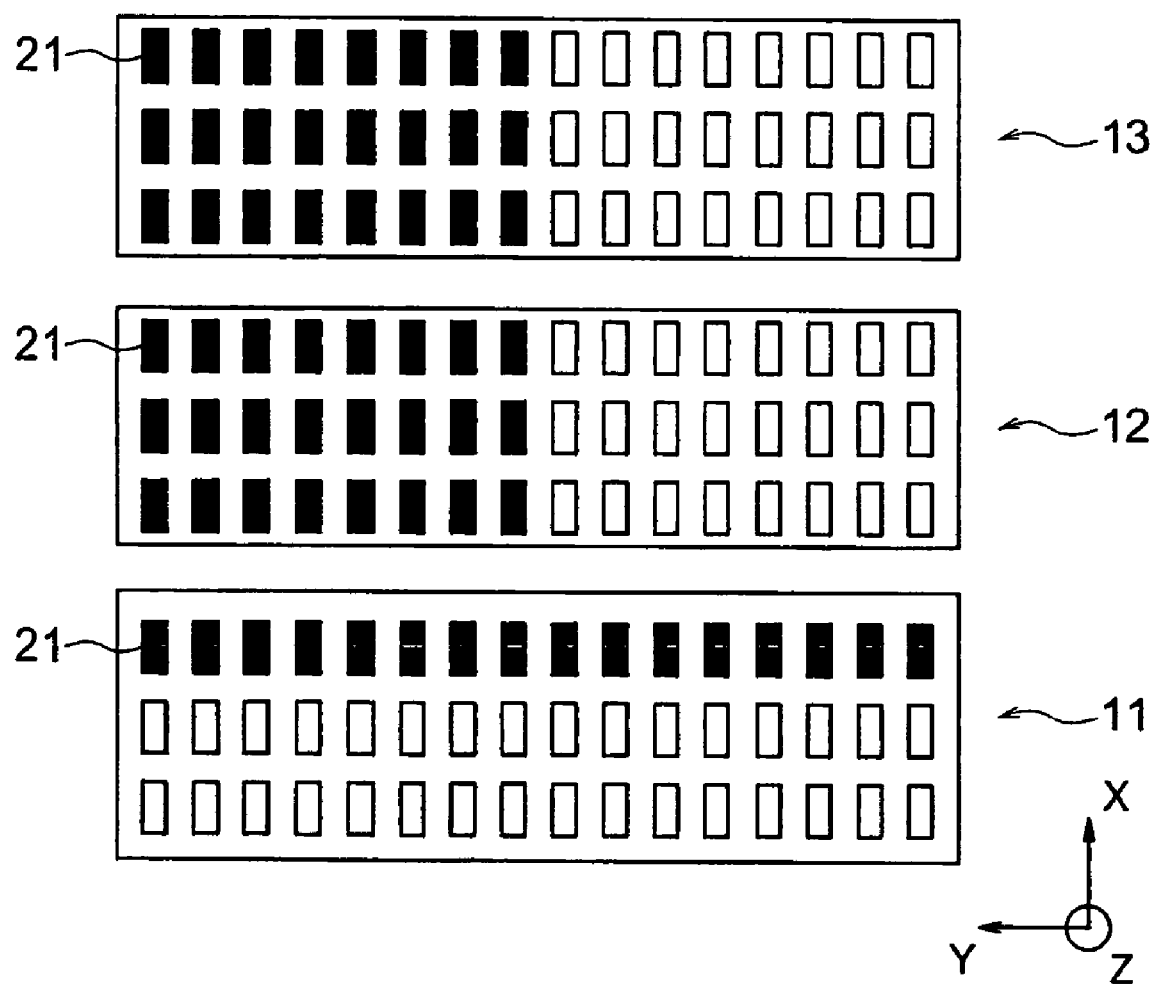
FIG. 10 is a view showing the test positions in the first round test of an arrangement of electronic devices to be tested on an electronic device conveying medium corresponding to FIG. 9.

FIG. 10 shows first test positions 21 of electronic devices 20 to be tested on the electronic device conveying medium 10 corresponding to FIG. 9, wherein the first electronic device conveying medium 11 loaded with electronic devices 20 to be tested in the first contact group 111, the second electronic device conveying medium 12 loaded with electronic devices 20 to be tested in the second contact group 112, and the third electronic device conveying medium 13 loaded with electronic devices 20 to be tested in the third contact group 113 are shown, respectively.

The first electronic device conveying medium 11 supplied from the loader section LD via the conveying means 400 is moved to a region above the first contact group 111 by the first moving device 201.

Next, electronic devices to be tested 20 in a range from the first row on the first column to the first row to the sixteenth column arranged on the first electronic device conveying medium 11 in FIG. 9 are moved to above the first contact group 111, and 16 electronic devices 20 in the range from the first row on the first column to the first row to the sixteenth column of the arrangement on the electronic device conveying medium 11 are tested in the first round.

When the test is finished, the movable head 201*c* having a grip head 201*d* gripping the electronic device conveying medium 11 elevates, then, moves to the X-axis direction by an amount of one row, and 16 electronic devices 20 in a range from the second row on the first column to the second row on the sixteenth column are tested in the second round.

When the test is finished, the movable head 201*c* gripping the electronic device conveying medium 11 elevates, then, moves to the X-axis direction by an amount of one row, and 16 electronic devices 20 in a range from the third row on the first column to the third row on the sixteenth column are tested in the third round.

Tests are conducted for three times in total for one electronic device conveying medium 11. When completing the tests for three times in total, it is discharged by the conveying means 400 to the unloader section UL, and a next electronic device conveying medium 11 is supplied from the loader section LD via the conveying means 400.

The second electronic device conveying medium 12 supplied from the loader section LD via the conveying means 400 is moved to a region above the second contact group 112 by the second moving device 202.

Next, electronic devices to be tested 20 in a range from the first row on the first column to the third row on the eighth column arranged on the second electronic device conveying medium 12 in FIG. 9 are moved to above the second contact group 112, and 24 electronic devices 20 in the range from the first row on the first column to the third row on the eighth column of the arrangement of the electronic device conveying medium 12 are tested in the first round.

When the test is finished, the movable head 201c having a grip head 202d gripping the electronic device conveying medium 12 elevates, then, moves to the Y-axis direction by an amount of eight columns, and 24 electronic devices 20 in the range from the first row on the ninth column to the third row on the sixteenth column are tested in the second round.

Tests are conducted for two times in total for one electronic device conveying medium 12. After completing the tests for two times in total, it is discharged by the conveying means 400 to the unloader section UL, and a next electronic device conveying medium 12 is supplied from the loader section LD via the conveying means 400.

The third electronic device conveying medium 13 supplied from the loader section LD via the conveying means 400 is moved to a region above the 113 by the third moving device 203.

Electronic devices 20 in a range from the first row on the first column to the third row on the eighth column arranged on the electronic device conveying medium 13 in FIG. 9 are moved to above the third contact group 113, and 24 electronic devices 20 in the range from the first row on the first column to the third row on the eighth column of the arrangement on the electronic device conveying medium 13 are tested in the first round.

When the test is finished, the movable head 203c having a grip head 203d gripping the electronic device conveying medium 13 elevates, then, moves to the Y-axis direction by an amount of 8 columns, and 24 electronic devices 20 in the range from the first row on the ninth column to the third row on the sixteenth column are tested in the second round.

Tests are conducted for two times in total for one electronic device conveying medium 13. When the tests for two times in total are completed, it is discharged by the conveying means 400 to the unloader section UL, and a next electronic device conveying medium 13 is supplied from the loader section LD via the conveying means 400.

Accordingly, until the tests on two electronic device conveying medium in the first contact group 111 are finished, tests on three electronic device conveying medium are finished in the second contact group 112, and tests on three electronic device conveying medium are finished in the third contact group 113 by the respectively independent moving devices.

Note that timing of tests of the first moving device 201, timing of tests of the second moving device 202, and timing of tests of the third moving device 203 are synchronized in the first moving device 201, the second moving device 202 and the third moving device 203 by the main controller MC, and tests are conducted at the same timing.

Also, by independently controlling the three moving devices 201, 202 and 203 by the sub controllers SC1, SC2 and SC3, it is possible to always secure the simultaneously measured number of 64 limited in the electronic device testing apparatus 1 on an arbitrary arrangement of electronic devices 20 on the electronic device conveying medium 10, and a high test efficiency can be realized.

As explained above, in the respective contact groups, when the tests on all electronic devices 20 on one electronic device conveying medium 10 are completed, it is exchanged to the next electronic device conveying medium 10 even when other contact groups are in operation and the operation can be performed independently without being affected by the progress of other contact groups' operations. Therefore, the simultaneously measured number of 32 or 64 limited in the electronic device testing apparatus can be secured with high possibility in an arbitrary arrangement of electronic devices 20 on the electronic device conveying medium 10, and a high test efficiency is realized.

However, when applying the above method for securing simultaneous measurement by a plurality of contact groups, timings of completing final tests in the respective contact groups 110 do not always match when a lot of the electronic devices 20 finishes; at a time one contact group completes tests, other contact groups cannot complete tests at the same time; and time is spent for the remaining tests.

Figure 11:
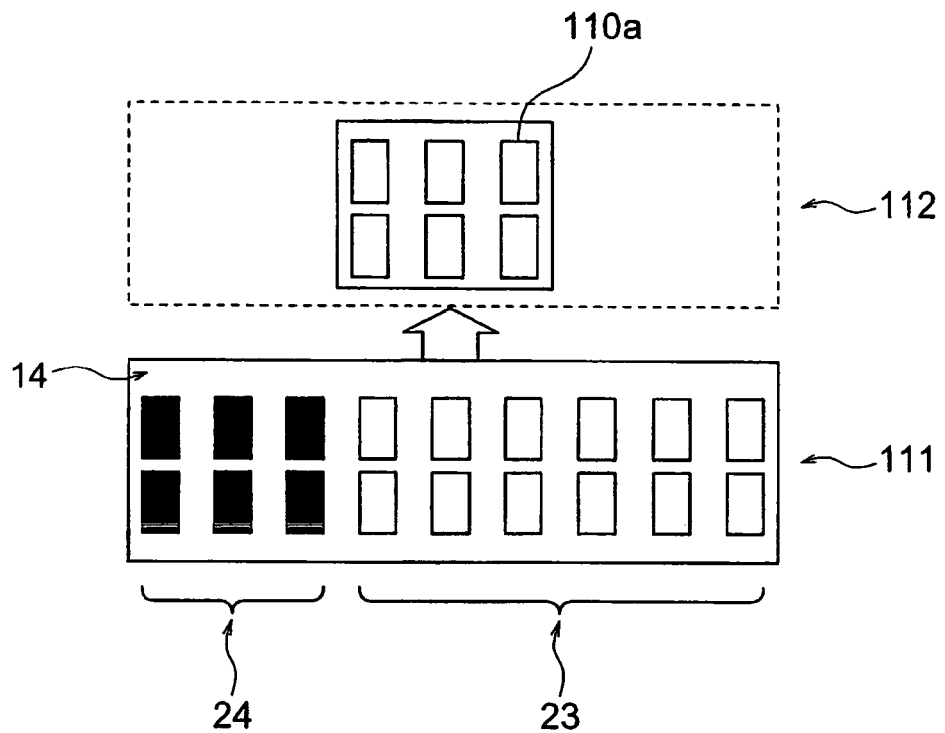
FIG. 11 is a view showing a processing method in the case where an electronic device conveying medium is already on a contact group when a lot of the electronic devices to be tested finishes.

As shown in FIG. 11, in the case where 6 electronic devices 24 (The electronic device 24 in FIG. 11 indicates all black squares.) in a range from the first row on the first column to the second row on the third column on the electronic device conveying medium 14 having the arrangement of two rows by nine columns are already tested in the first contact group composed of two contact portions (it is not illustrated because the first contact group 11 positions under the final electronic device conveying medium 14 in FIG. 11.) and the second contact group 112 composed of 6 contact portions 110a completes the tests at that point; a test on electronic devices 23 yet to be tested in the first contact group 111 is not continued and suspended, and electronic devices 23 are moved to the second contact group 112 having a large number of contact portions 110a to conduct the test, so that the remaining test time can be reduced to one third (note that the moving time between the contacts is not included).

For example, the main controller MC perceives that the second contact group 112 already finished the tests from a test end signal issued when tests on electronic devices 20 loaded on the final electronic device conveying medium 10 finish in the respective moving devices.

Next, in the main controller MC, a sum of time for suspending a test in the first contact group 111 and moving the electronic device conveying medium 14 to the second contact group 112 and time after moving to the second contact group 112 till completion of the test by conducting it in the contact group 112 is compared with time till completing the test by continuing the test in the first contact group 111. Note that the time till completion of the test when conducting the test in the second contact group 112 after moving to the second contact group 112 is drawn from the number of contact portions 110a of the second contact group 112 finished with tests and the number of remaining electronic devices 23. Also, time till completion of tests when continuing the tests in the first contact group 111 is drawn from the number of contact portions 110a of the first contact group 111 already started a test when finishing a lot of the electronic devices 20 and the number of remaining electronic devices 23.

When the time till completion of the test becomes the shortest in the contact group 112 already finished with the tests from the comparison, an instruction for the first sub controller SC1 to suspend the test and moving the electronic device conveying medium 10 to the second moving device 202 is given from the main controller MC to the respective sub controllers SC1 and SC2, and the second moving device 202 receives the electronic device conveying medium 14 and conducts the test, consequently, the remaining time can be made short.

As explained above, a test already started on electronic devices 20 in the contact group 111 is suspended in the contact group 111 having remaining tests when a lot of the electronic devices 20 to be tested finishes; and control of returning to the loader section LD by the conveying means 400 and moving to other contact group 112 having a large number of contact portions 110a already finished with tests via the conveying means 400, or control of supplying the electronic device conveying medium 14 directly to the second contact group 112 by the first moving device 201 and the second moving device 202 not via the loader section LD, etc. is performed; so that the remaining test time at the time a lot of the electronic devices 20 finishes can be made short.

Figure 12:
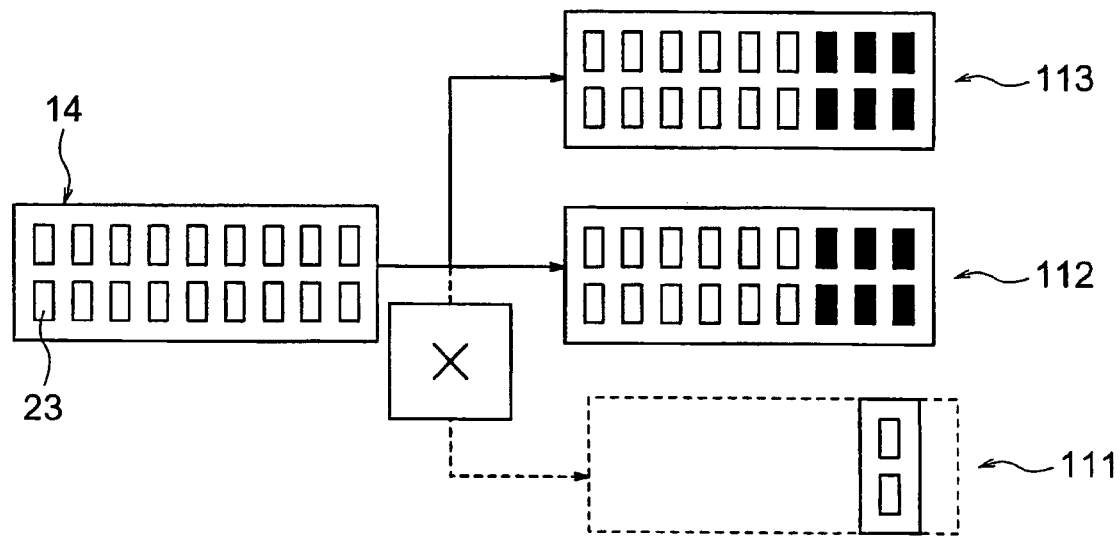
FIG. 12 is a view showing a processing method in the case where an electronic device conveying medium is not on a contact group when a lot of the electronic devices to be tested finishes.

Also, at the time a lot of the electronic devices 20 to be tested finishes as in the example shown in FIG. 12, when the final electronic device conveying medium 14 yet to be supplied to the first contact group 111 is tested in the first contact group 111 having two contact portions, the remaining time becomes long. Therefore, a method of not supplying the electronic device conveying medium 14 to the first contact portion 111 but supplying to the second contact 112 having a large number of contact portions as 6 or to the third contact 113 having 6 contact portions already finished with tests and conducting a test is considered, so that the remaining test time can be reduced to one third.

For example, in the main controller MC, time for completing tests by conducting the tests in the first contact group 111 drawn from the number of contact portions 110a of the first contact group 111 and the number of remaining electronic devices 23 on the final electronic device conveying medium 14 yet to be supplied when the lot finishes is compared with time for completing the tests in the contact groups 112 or 113 drawn from the number of contact portions 110a of the contact groups 112 or 113 already finished with tests and the number of remaining electronic devices 23 on the final electronic device conveying medium 14 yet to be supplied.

When the time for completing the tests becomes the shortest in the second contact group 112 or the third contact group 113 from the comparison, an instruction for making the first moving device 201 to suspend supply of the electronic device conveying medium 14 to the first contact group 111 and to supply the electronic device conveying medium 14 to the second moving device 202 is output from the main controller MC to the sub controllers SC1 and SC2, and the second moving device 202 receives the electronic device conveying medium 14 to conduct tests, so that the remaining time can be made short.

Also, at the time that the lot of the electronic devices 20 finishes, in the case where the electronic device conveying medium 14 yet to be supplied to the first contact group 111 is not the final one and there are more than one, for example, the main controller MC compares a sum of standby time for conducting tests in the first contact group 111 and test time in the first contact group 111, a sum of standby time for conducting tests in the second contact group 112 and test time in the second contact group 112, and a sum of standby time for conducting tests in third contact group 113 and test time in the third contact group 113.

Note that when moving times to the respective contact groups are different, it has to be also considered.

By not to supply the remaining electronic device conveying medium 14 yet to be supplied (not limited to the final one) to a contact group as above, but to determine a contact group to be supplied based on the number of electronic devices 23 on the electronic device conveying medium 14, numbers of contact portions 110a of the respective contact groups and standby time till tests, and to control to supply to the respective contact groups, the remaining test time can be made short.

As explained above, in the present invention, as a result that a plurality of contact groups are provided to the test head portion and independent moving devices attached thereto are provided, flexibility between the respective contact groups in the electronic device testing apparatus can be enhanced for a limited simultaneously measured number, and the remaining test time at the time the lot of the electronic devices 20 finishes can be made short.

Note that it is not limited to the above control method, and an electronic device testing apparatus provided with control for finishing tests with the shortest time on electronic devices to be tested on a remaining electronic device conveying medium at the time the lot of the electronic devices finishes is included; and an electronic device testing apparatus provided with control of suspending a test on electronic devices already under a test in the contact group and moving the electronic device conveying medium loaded with the electronic devices to be tested to other contact group having a large number of contact portions already finished with tests when the electronic device conveying medium loaded with electronic devices to be tested are already on a contact group at the time the lot of the electronic devices finishes is included.

Also, it is not limited to the above control method, and an electronic device testing apparatus provided with control for supplying remaining electronic device conveying medium loaded with electronic devices to be tested yet to be supplied to a contact group at the time the lot of the electronic devices finishes to other contact group already finished with tests by considering the number of electronic devices to be tested on the electronic device conveying medium, the number of contact portions of the respective contact groups, and standby time till tests is included.

Also, in FIG. 11 and FIG. 12, for a plain explanation, numbers of the contact portions 110 in the respective contact groups 111, 112 and 113 were set as above, but actually the total number of the contact portions of the respective contact groups matches with the simultaneously measured number limited in the electronic device testing apparatus due to an existence of other contact groups.

Second Embodiment

In a test of an electronic device to be tested 20 on a wafer 701, test positions by the simultaneously measured number can be always secured in a few cases particularly in measurement near the outer circumference of the wafer 701, the situation is that only less test positions than the simultaneously measured number can be secured.

The present invention can be applied not only to the case of testing an electronic device conveying medium 10 of a strip-format, etc. described in the first embodiment, but to the case of testing electronic devices to be tested 20 on a wafer 701, and is advantageous to secure test positions by the simultaneously measured number.

Figure 13:
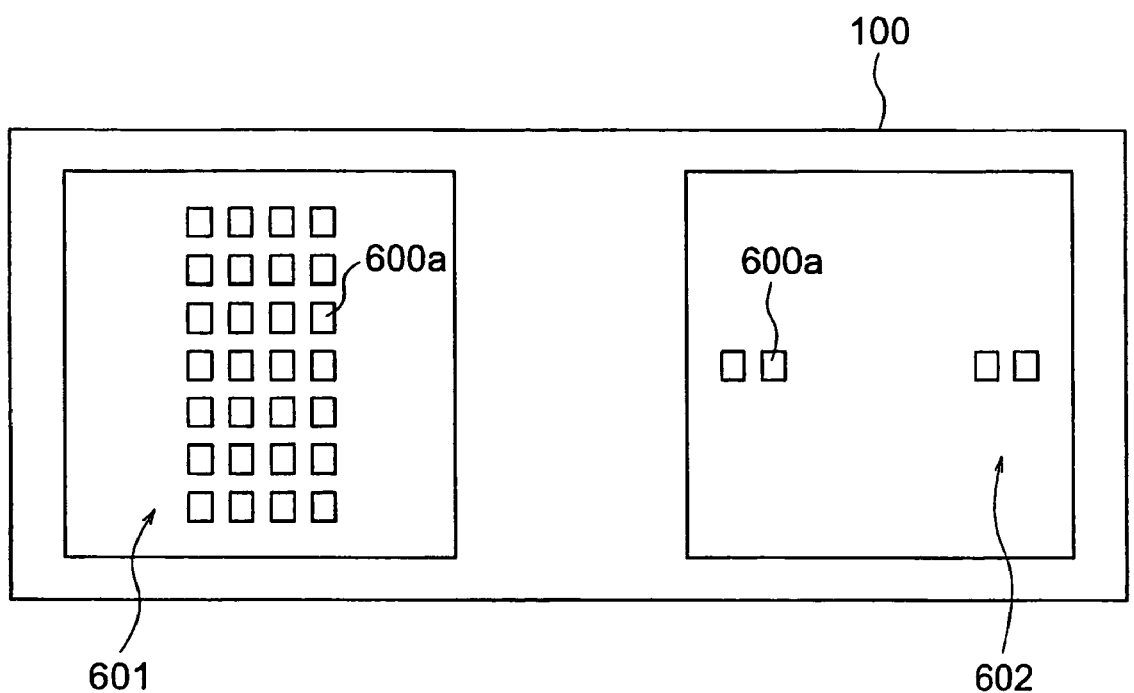
FIG. 13 is a view showing an arrangement of respective prober groups corresponding to electronic devices arranged on a wafer in a second embodiment of the present invention.
Figure 14:
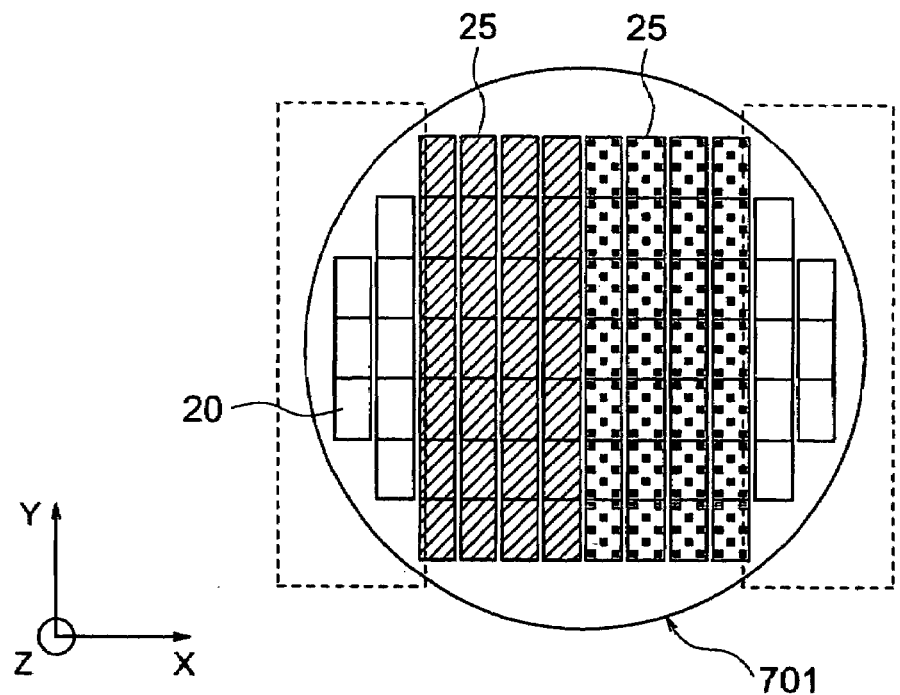
FIG. 14 is a view showing test positions in a first prober group.

As shown in FIG. 13, the test head portion 100 is composed of two prober groups: a first prober group 601 having 28 probers 600a and a second prober group 602 having 4 probers 600a. The simultaneously measured number in this case is 32. Among 72 electronic devices 20 to be tested on the seven lines on twelve rows on the wafer 701 (note that there is not an electronic device 20 near the outer circumferential portion: at the first row on the first column, the first row on the second column, the first row on the eleventh column, the first row on the twelfth column, the second row on the first column, the second row on the twelfth column, the sixth row on the first column, the sixth row on the twelfth column, the seventh row on the first column, the seventh row on the second column, the seventh row on the eleventh column, and the seventh row on the twelfth column) supplied from a loader section (not shown), 28 electronic devices 20 in a range from the first row on the third column to the seventh row on the sixth column as shown in FIG. 14 are tested in the first round in the first prober group 601. The movable head (not shown) having a grip head (not shown) gripping the wafer 701 is elevated, then, moved to the X-axis direction by an amount of four rows. In the second round, 28 electronic devices 20 in a range from the first row on the seventh column to the seventh row on the tenth column are tested. The total of 56 electronic devices 20 as test positions 25 in the first prober group 601 (the test positions 25 in the first prober group 601 are squares having a pattern in FIG. 14) are tested by two-time test in total, and the wafer 701 is given to the second prober 602.

Note that it is not limited to a method of giving the wafer 701 finished with the test in the first prober 601 to the second prober 602, but a method of giving to an unloader section (not shown) for each prober group, etc. may be considered.

The first wafer 701 moves to the second prober group 602 after the test is completed by the first prober group 601, and two electronic device 20 at the second row on the second column and the second row on the eleventh column are tested in the first round.

When the tests are completed, the movable head (not shown) having a grip head (not shown) gripping the wafer 701 is elevated, then moved to the Y-axis direction by an amount of one column, and four electronic devices 20 at the third row on the first column, the third row on the second column, the third row on the eleventh column and the third row on the twelfth column are tested in the second round.

When the tests are finished, the movable head holding the wafer 701 is elevated, then, moved to the Y-axis direction by an amount of one column, and four electronic devices 20 at the fourth row on the first column, the fourth row on the second column, the fourth row on the eleventh column and the fourth row on the twelfth column are tested in the third round.

When the tests are finished, the movable head holding the wafer 701 is elevated, then, moved to the Y-axis direction by an amount of one column, and four electronic devices 20 at the fourth row on the first column, the fourth row on the second column, the fourth row on the eleventh column, and the fourth row on the twelfth column are tested in the third round.

When the tests are finished, the movable head holding the wafer 701 is elevated, then, moved to the Y-axis direction by an amount of one column, and four electronic devices 20 at the fifth row on the first column, the fifth row on the second column, the fifth row on the eleventh column, and the fifth row on the twelfth column are tested in the fourth round.

Figure 15:
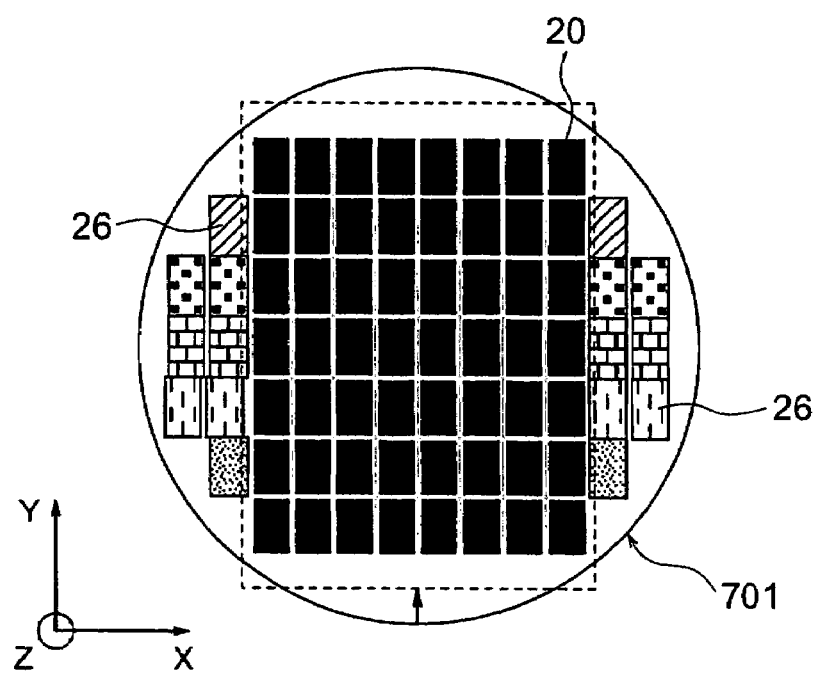
FIG. 15 is a view showing test positions in a second prober group.
Figure 16:
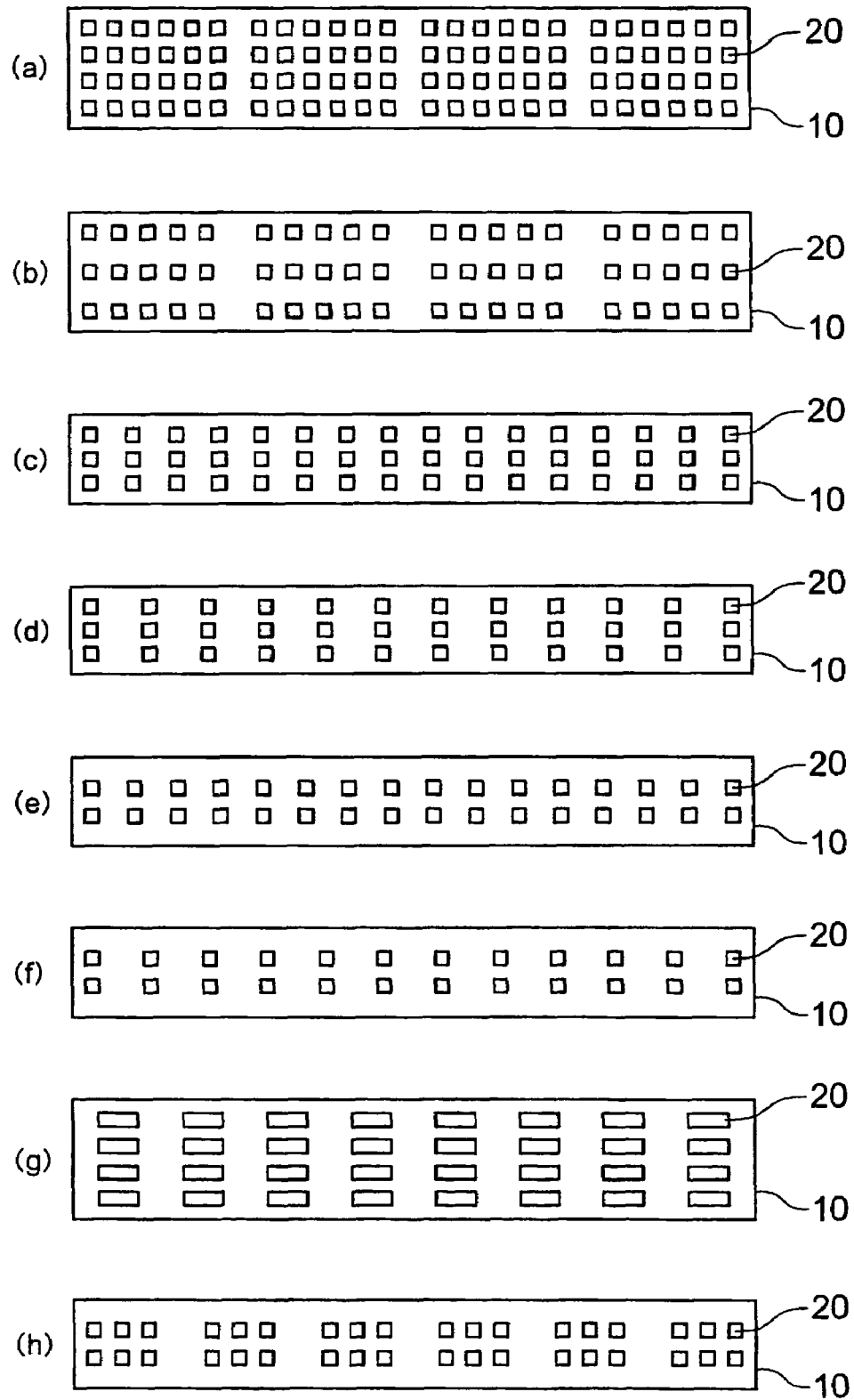
Figure 17:
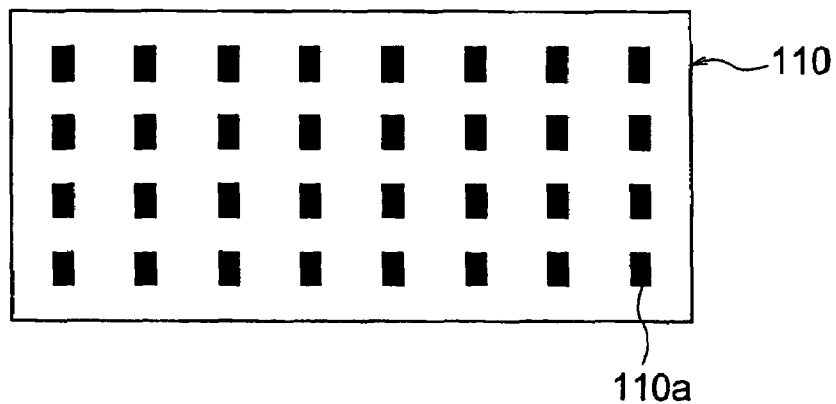
FIG. 17 is a view showing an arrangement of one contact group composed of contact portions by the simultaneously measured number of 32 (4 rows by 8 columns) of the prior art.
Figure 18:
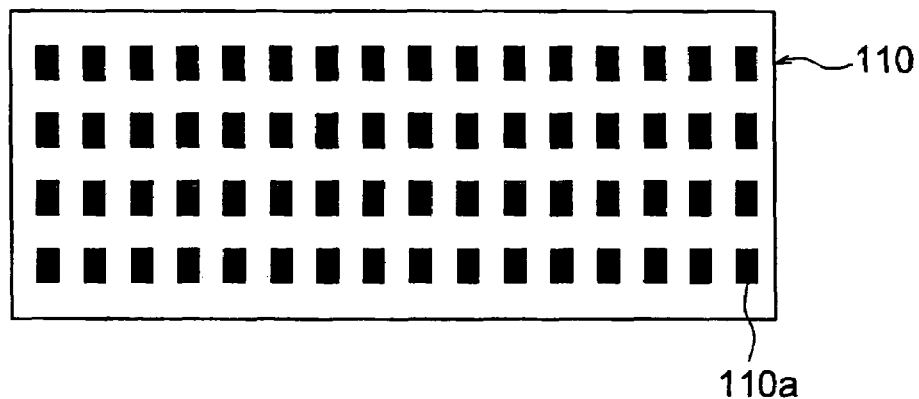
FIG. 18 is a view showing an arrangement of one contact group composed of contact portions by the simultaneously measured number of 64 (4 rows by 16 columns) of the prior art.
Figure 19:
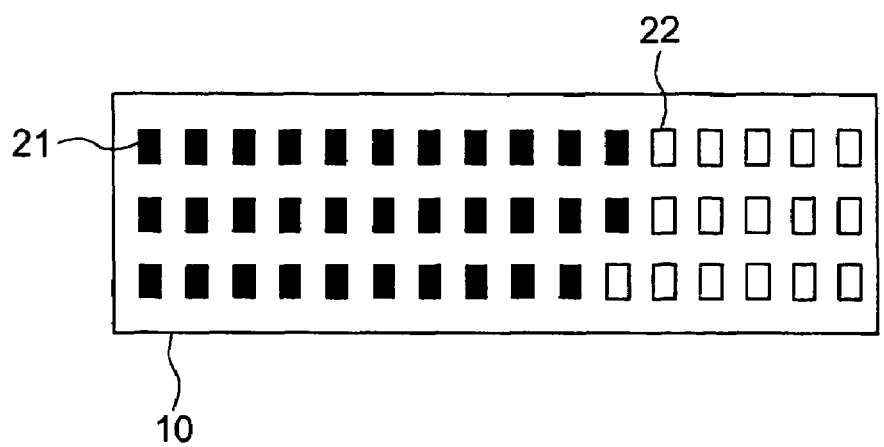
FIG. 19 is a view showing positions able to be measured at a time in the first test and the second test in the case of electronic device conveying media (3 rows by 16 columns).

When the tests are finished, the movable head holding the wafer 701 is elevated, then, moved to the Y-axis direction by an amount of one column, and two electronic devices 20 at the sixth row on the second column and the sixth row on the eleventh column are tested in the fifth round. Then, 16 electronic devices 20 in total as tests positions 26 of the second prober group 602 (the test positions 26 in the second prober group 601 are squares having a pattern in FIG. 15) are finished by five-round tests in total.

After tests are finished in the second prober group 602, the wafer 701 is given to the unloader section, and the next wafer is supplied from the first prober group 601 or a loader section being independent for each prober group.

Note that timing of the test by the first prober group 601 and timing of the test by the second prober group 602 are synchronized in the respective moving devices by the main controller MC (not shown), and tests are conducted at the same timing.

When conducting tests on electronic devices 20 on the wafer 701 as explained above, by dividing a prober group to the first prober group 601 for testing electronic devices 20 existing at the center portion of the wafer 701 and to the second prober group 602 for testing electronic devices 20 existing near the outer circumference, test positions close to the simultaneously measured number of 32 can be secured. High test efficiency is realized in tests particularly on electronic devices near the outer circumference on the wafer 701, where test positions by the simultaneously measured number cannot be always secured in many cases.

Note that a method of gripping the wafer 701 by a grip head and moving a movable head having the grip head was applied in the above embodiment, but it is not limited to the method, and a method of fixing the wafer 701 and performing positional control on the prober groups with respect to the electronic devices 20 may be also considered.

Note that the embodiments explained above are described to facilitate understanding of the present invention and is not to limit the present invention. Accordingly, respective elements disclosed in the above embodiments include all design modifications and equivalents belonging to the technical scope of the present invention.

For example, the case of the first embodiment may be applied to an electronic device testing apparatus for a method of covering the whole test head portion 100 with a chamber for conducting a test in a state of applying a thermal stress or other methods, and the electronic device testing apparatus of the present invention includes these.

Also, the number of contact groups in the electronic device testing apparatus, the number and the arrangement of contact portions in the respective contact groups are not limited to the above numbers, and an order of tests for the arrangement includes all optimal numbers derived from the number and the arrangement of electronic devices 20 on the electronic device conveying medium 10, and the production plan, etc.

Note that the simultaneously measured numbers in the embodiments of the present invention are not limited to the above numbers and may be applied to simultaneously measured numbers of $2^n$.

The invention claimed is:

1. An electronic device testing apparatus for conducting a test by pressing input/output terminals of electronic devices to be tested against sockets of a test head, wherein:

the test head has a plurality of socket groups each of which is composed of a set of the sockets;

the electronic device testing apparatus comprising;

a plurality of moving devices each of which is capable of independently moving a strip format loaded with the electronic devices to the socket groups and pressing the electronic devices against the sockets while holding the electronic devices on the strip format, wherein the electronic devices are moved together with an entirety of the strip format.

2. The electronic device testing apparatus as set forth in claim 1, wherein the number of sockets which include at least two of a plurality of the socket groups are mutually different.

3. An electronic device testing apparatus for conducting a test by pressing input/output terminals of electronic devices to be tested against sockets of a test head wherein:

the test head has a plurality of socket groups each of which includes a set of the sockets;

the electronic testing apparatus comprising;

a plurality of moving devices each of which is capable of independently moving a strip format loaded with the electronic devices to the sockets and pressing the electronic devices against said the sockets while holding the electronic devices on the strip format; and a control device configured to finish tests with the shortest time on the remaining electronic devices on the strip format when a lot of the electronic devices finishes.

4. The electronic device testing apparatus as set forth in claim 3, wherein in the case where the strip format loaded with the electronic devices is already on the socket group when a lot of the electronic devices finishes, the control device suspends a test on the electronic devices already under the test in the socket group and outputs an instruction to move the strip format loaded with the electronic devices to another socket group already finished with the test and having a large number of sockets.

5. The electronic device testing apparatus as set forth in claim 3, wherein the control device determines which socket group the strip format loaded with the remaining electronic devices yet to be supplied to any socket group when a lot of the electronic devices finishes should be supplied, based on the number of the electronic devices on the strip format, the number of sockets in respective socket groups, and standby time until a test.

6. The electronic device testing apparatus as set forth in any one of claims 1 and 3 to 5, wherein each of the moving devices moves by gripping the strip format loaded with the electronic devices from a loading position of pre-test electronic devices to a corresponding socket group.

7. The electronic device testing apparatus as set forth in any one of claims 1 and 3 to 5, wherein each of the moving devices moves by gripping the strip format loaded with the electronic devices from the corresponding socket group to a loading position of post-test electronic devices.

8. The electronic device testing apparatus as set forth in any one of claims 1 and 3 to 5, wherein a sum of the numbers of sockets composing the plurality of socket groups in the test head is $2^n$ ("n" is a natural number).

9. The electronic device testing apparatus as set forth in claim 8, wherein n=5.

10. The electronic device testing apparatus as set forth in claim 8, wherein n=6.

* * * * *